(12) United States Patent
Tamada

(10) Patent No.: US 7,983,091 B2
(45) Date of Patent: Jul. 19, 2011

(54) DIVIDED BITLINE FLASH MEMORY ARRAY WITH LOCAL SENSE AND SIGNAL TRANSMISSION

(75) Inventor: Satoru Tamada, Kamakura (JP)

(73) Assignee: Intel Corporation, Santa Clara, CA (US)

( * ) Notice: Subject to any disclaimer, the term of this patent is extended or adjusted under 35 U.S.C. 154(b) by 578 days.

(21) Appl. No.: 11/935,706

(22) Filed: Nov. 6, 2007

(65) Prior Publication Data
US 2009/0119446 A1      May 7, 2009

(51) Int. Cl.
*G11C 16/06* (2006.01)
(52) U.S. Cl. .......... 365/185.25; 365/185.13; 365/185.33
(58) Field of Classification Search ............ 365/185.25, 365/185.13, 185.33
See application file for complete search history.

(56) References Cited

U.S. PATENT DOCUMENTS 6,381,671 B1 * 4/2002 Ayukawa et al. ............. 711/104
6,928,003 B2 * 8/2005 Miura ...................... 365/189.05

OTHER PUBLICATIONS

Kobayashi,S, et al "A 3.3V—Only 16Mb DINaR Flash Memory" ISSCC95 digest of technical papers, pp. 122-123, Feb. 1995.

* cited by examiner

*Primary Examiner* — Pho M Luu
(74) *Attorney, Agent, or Firm* — Grossman, Tucker, Perreault & Pfleger, PLLC

(57) ABSTRACT

A flash memory array and a method for performing read operation therein are disclosed. The flash memory array comprises a plurality of memory segment, a data cache and a plurality of data handlers coupled between a pair of memory segment and between a memory segment and the data cache. A read operation of selected bitlines of a selected memory segment is performed by a segment data handler coupled to the selected memory segment locally and the read data is transmitted to the data cache. A segment data handler is configured to get read data from the selected bitlines by first pre-charging the bitlines and sensing the bitlines. Further, the read data is transmitted to the data cache through all of the segment data handlers in a sequential manner, if present between the selected memory segment and the data cache.

5 Claims, 21 Drawing Sheets

— o — o — o  precharge
— △ — △ — △  shield
— · — · — · —  Discharged by MC
— □ — □ — □  Sense bitline node
— × — × — ×  Discharged by Data Handler

US 7,983,091 B2

DIVIDED BITLINE FLASH MEMORY ARRAY WITH LOCAL SENSE AND SIGNAL TRANSMISSION

FIELD OF THE DISCLOSURE

The present disclosure generally relates to semiconductor memory and, more particularly, to flash memory array having divided bitlines.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "a" and "an" herein do not denote a limitation of quantity, but rather denote the presence of at least one of the referenced item.

Figure 1:
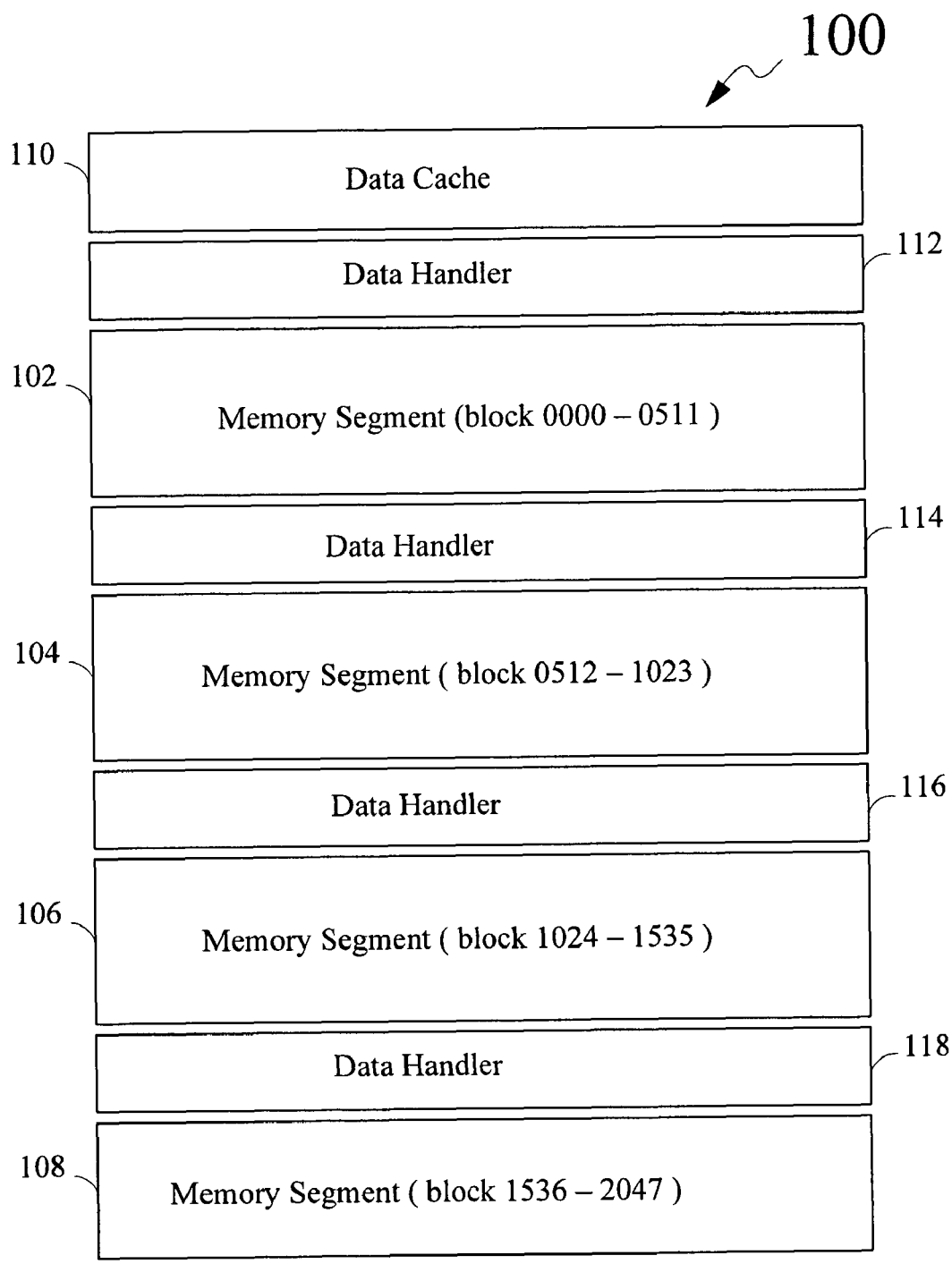
FIG. 1 is a schematic diagram illustrating an arrangement of a flash memory array 100, according to an exemplary embodiment of the present disclosure.

FIG. 1 is a schematic diagram illustrating a flash memory array 100, according to an exemplary embodiment of the present disclosure. The flash memory array 100 comprises a plurality of memory segments such as a memory segment 102, a memory segment 104, a memory segment 106 and a memory segment 108; a data cache 110; and a plurality of segment data handlers such as a data handler 112, a data handler 114, a data handler 116 and a data handler 118.

The flash memory array 100 of FIG. 1 is an exemplary flash memory array comprising 2048 memory cell blocks (hereinafter referred to as blocks). These blocks are divided into the memory segments 102, 104, 106 and 108. For example, as shown in FIG. 1, the memory segment 102 comprises 512 blocks starting from a block 0000 to a block 0511. Similarly, each of the memory segments 104, 106 and 108 comprises 512 blocks from block 0512 to block 1023, from block 1024 to block 1535 and block 1536 to block 2047, respectively.

These blocks have a plurality of bitlines through which a read operation of the blocks may be performed. In a typical read operation in the flash memory array 100, a set of bitlines may of a memory segment are selected at a time for the read operation, (hereinafter the set of bitlines referred to as 'selected bitlines' and the memory segment as a 'selected memory segment'). For example, odd numbered bitlines may be selected at a time for the read operation in a selected memory segment from the memory segment 102, 104, 106 and 108.

The data cache 110 is used to store read data from the selected bitlines of the selected memory segment. In an embodiment of the present disclosure, the data cache 110 may be configured on an edge of the memory array 100. The data handler 112 is coupled between the data cache 110 and the memory segment 102. Similarly, the data handlers 114 is coupled between the memory segment 102 and the memory segment 104, the data handler 116 is coupled between the memory segment 104 and the memory segment 106, and the data handler 118 is couple between the memory segment 106 and the memory segment 108, respectively.

In the read operation in the flash memory array 100, the selected bitlines of the selected memory segment are precharged by a data handler coupled to the selected memory segment. Further, the selected bitlines of the selected memory segment are sensed locally by the data handler coupled to the selected memory segment to get read data. The sensed read data (hereinafter interchangeably referred to as 'read data') is further transmitted to the data cache 110 through a sequential transmission through the data handler(s), if present, between the data handler coupled to the selected memory segment and the data cache 110. The data handlers 112, 114, 116 and 118 are configured such that each data handler may transmit the read data towards the data cache 110 through the other data handlers between the data handler and the data cache 110. For example, when the memory segment 106 is selected, the selected bitlines of the memory segment 106 is sensed by the data handler 116. The sensed read data is transmitted to the data handler 114. Further, the sensed read data is transmitted to the data handler 112 from the data handler 114 and finally to the data cache 110. More specifically, the read operation of the selected memory segment comprises phases such as precharge phase, sense phase and transmission phase and these phases are described in detail in conjunction with FIGS. 4A-4C and FIG. 6A-6G.

Figure 2A:
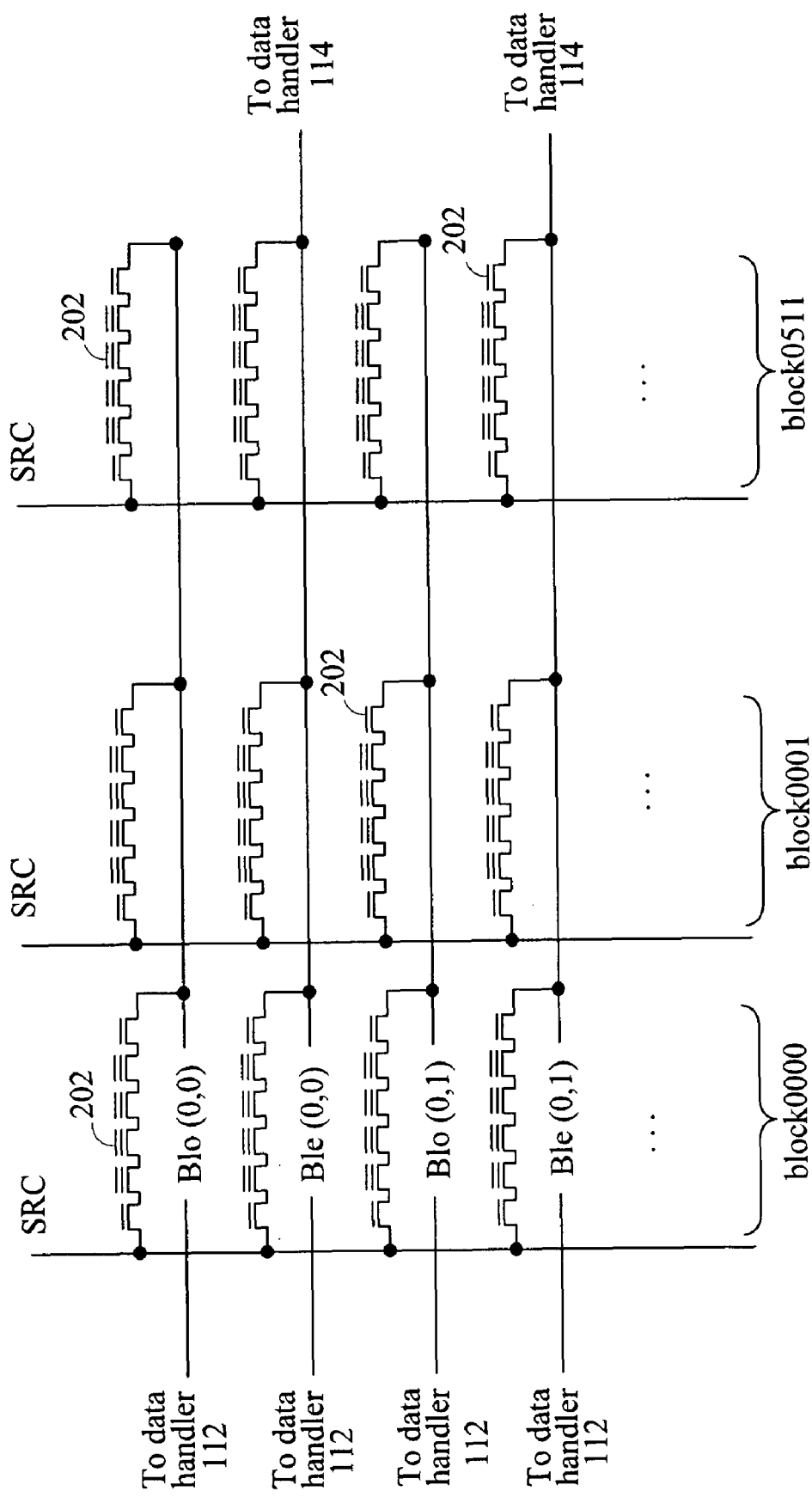
FIG. 2A is a schematic diagram illustrating a memory segment 102 of the flash memory array of FIG. 1, according to an exemplary embodiment of the present disclosure.

FIG. 2A illustrates a schematic diagram of the memory segment 102, according to an exemplary embodiment of the present disclosure. The memory segment 102 lays between the data handler 112 and the data handler 114. The memory segment 102 includes blocks starting from the block 0000 to the block 0511. These blocks include a plurality of memory cells configured by a set of transistors 202. These blocks are connected in a serial manner and sources of the transistors 202 are connected to a common line 'SRC'.

As shown in FIG. 2A, the memory segment 102 comprises common bitlines BLo (0, 0), BLe (0, 0), BLo (0, 1) and BLe (0, 1) for the block 0000 to the block 0511. The BLo (0, 0) may represent a first odd bitline of the memory segment 102 and the BLe (0, 0) may represent a first even bitline of the memory segment 102. Similarly, the BLo (0, 1) may represent a second odd bitline of the memory segment 102 and the BLe (0, 1) may represent a second even bitline of the memory segment 102. As shown in FIG. 2A, the bitlines BLo (0, 0), BLe (0, 0), BLo (0, 1) and BLe (0, 1) of the memory segment 102 are connected to the data handler 112 on one side and on the other side, the bitlines BLe (0, 0) and BLe (0, 1) are connected to the data handler 114. When the memory segment 102 is selected for the read operation, the selected bitlines of the memory segment 102 are sensed by the data handler 112, which is further described in conjunction with FIG. 4B.

Figure 2B:
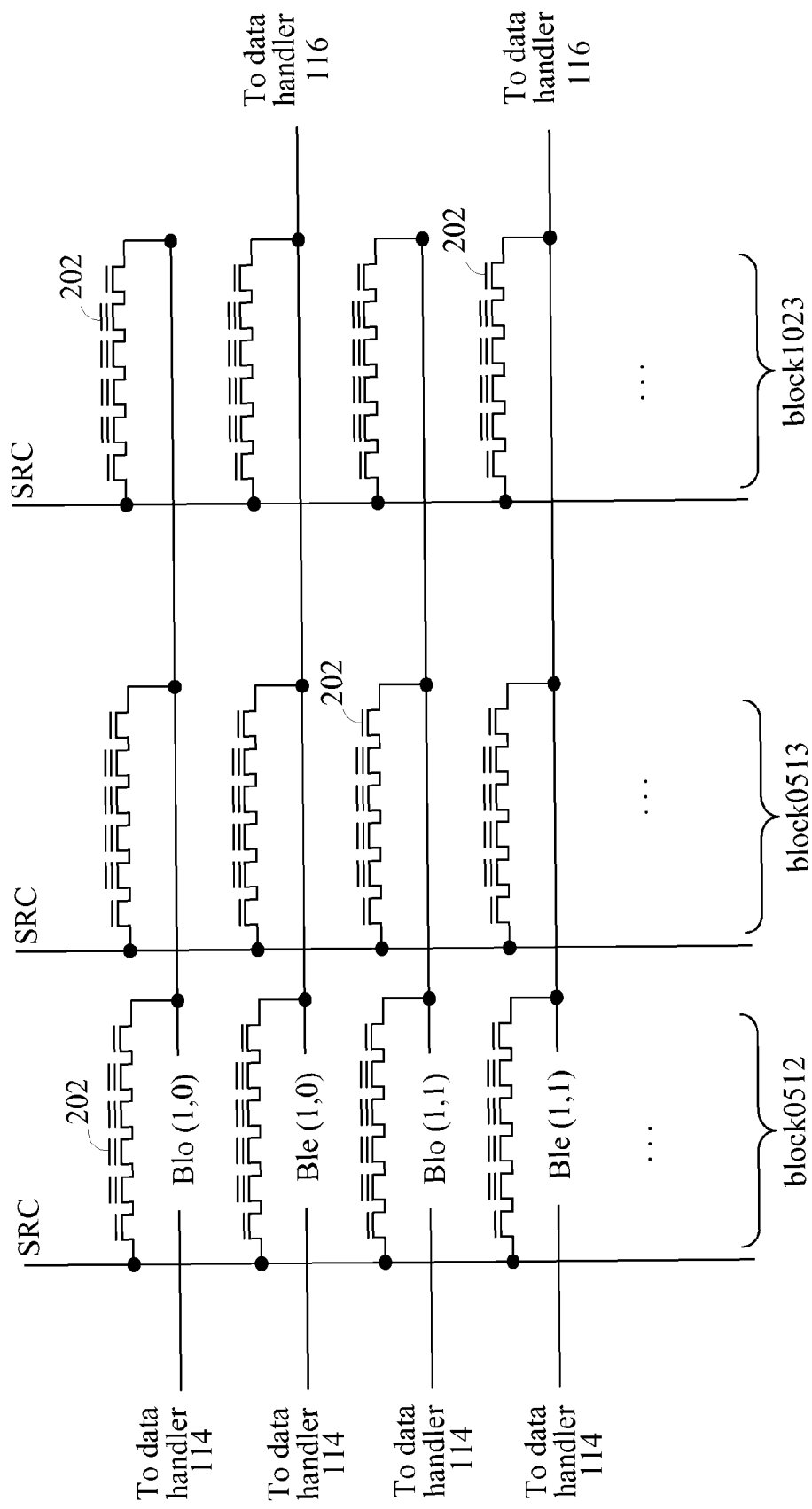
FIG. 2B is a schematic diagram illustrating a memory segment 104 of the flash memory array of FIG. 1, according to an exemplary embodiment of the present disclosure.

FIG. 2B illustrates a schematic diagram of the memory segment 104, according to an exemplary embodiment of the present disclosure. The memory segment 104 lays between the data handler 114 and the data handler 116. The memory segment 104 includes blocks starting from the block 0512 to the block 1023. These blocks are connected in a serial manner and the sources of the transistors 202 are connected to the common line 'SRC' in a similar fashion as the memory segment 102 explained in conjunction with FIG. 2A.

As shown in FIG. 2B, the memory segment 104 comprises common bitlines BLo (1, 0), BLe (1, 0), BLo (1, 1) and BLe (1, 1) for the block 0512 to the block 1023. The BLo (1, 0) may represent a first odd bitline of the memory segment 104 and the BLe (1, 0) may represent a first even bitline of the memory segment 104. Similarly, the BLo (1, 1) may represent a second odd bitline of the memory segment 104 and the BLe (1, 1) may represent a second even bitline of the memory segment 104. As shown in FIG. 2B, the bitlines BLo (1, 0), BLe (1, 0), BLo (1, 1) and BLe (1, 1) of the memory segment 104 are connected to the data handler 114 on one side and on the other side, the bitlines BLe (1, 0) and BLe (1, 1) are connected to the data handler 116. When the memory segment 104 is selected for the read operation, the selected bitlines of the memory segment 104 are sensed by the data handler 114, which is further described in conjunction with FIG. 4B.

Figure 2C:
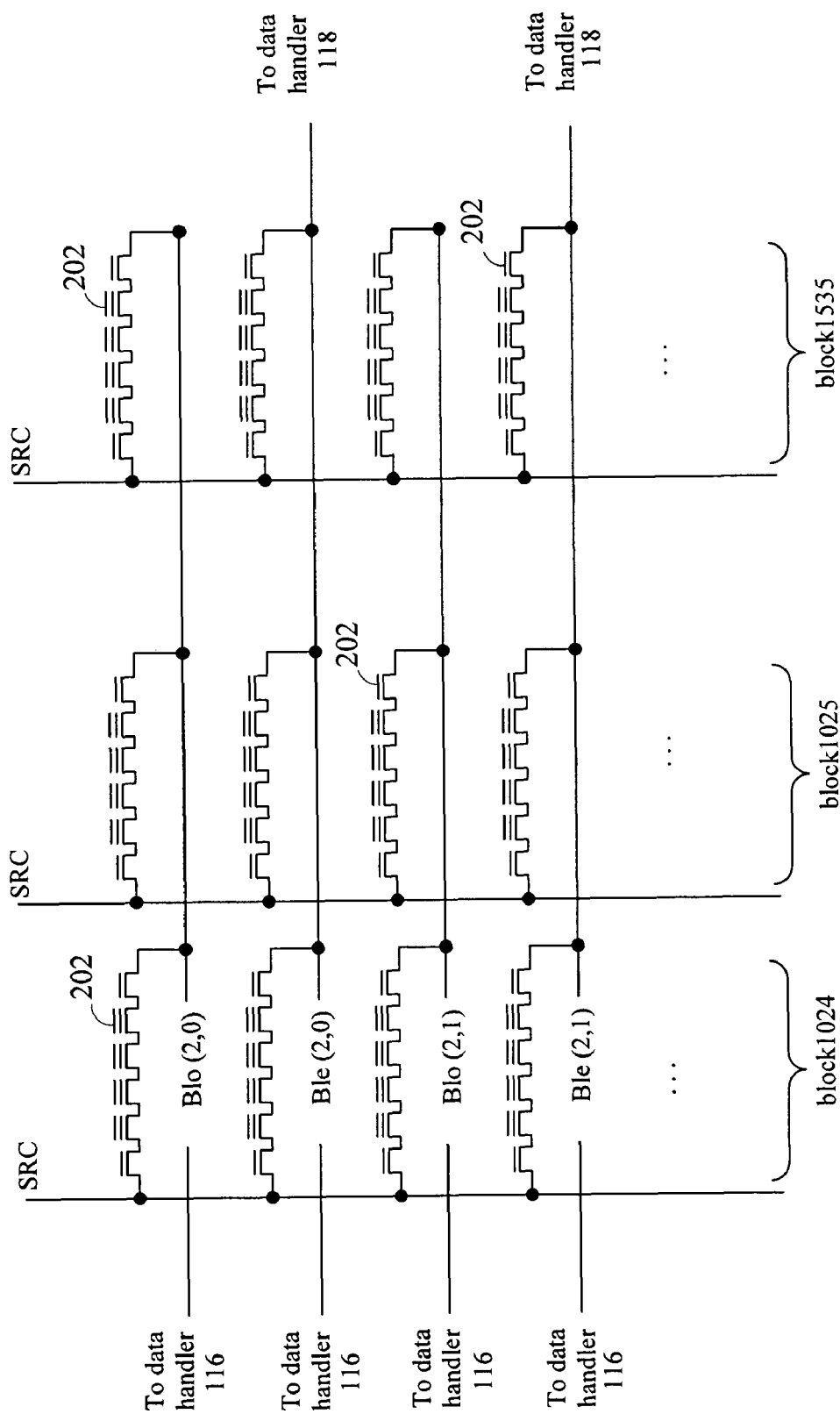
FIG. 2C is a schematic diagram illustrating a memory segment 106 of the flash memory array of FIG. 1, according to an exemplary embodiment of the present disclosure.

FIG. 2C illustrates a schematic diagram of the memory segment 106, according to an exemplary embodiment of the present disclosure. The memory segment 106 lays between the data handler 116 and the data handler 118. The memory segment 106 includes blocks starting from the block 1024 to the block 1535. These blocks are connected in a serial manner and the sources of the transistors 202 are connected to the common line 'SRC' in a similar fashion as the memory segment 102, explained in conjunction with FIG. 2A.

As shown in FIG. 2C, the memory segment 106 comprises common bitlines BLo (2, 0), BLe (2, 0), BLo (2, 1) and BLe (2, 1) for the block 1024 to the block 1535. The BLo (2, 0) may represent a first odd bitline of the memory segment 106 and the BLe (2, 0) may represent a first even bitline of the memory segment 106. Similarly, the BLo (2, 1) may represent a second odd bitline of the memory segment 106 and the BLe (2, 1) may represent a second even bitline of the memory segment 106. As shown in FIG. 2C, the bitlines BLo (2, 0), BLe (2, 0), BLo (2, 1) and BLe (2, 1) of the memory segment 106 are connected to the data handler 116 on one side and on the other side, the bitlines BLe (2, 0) and BLe (2, 1) are connected to the data handler 118. When the memory segment 106 is selected for the read operation, the selected bitlines of the memory segment 106 are sensed by the data handler 116, which is further described in conjunction with FIG. 4B.

Figure 2D:
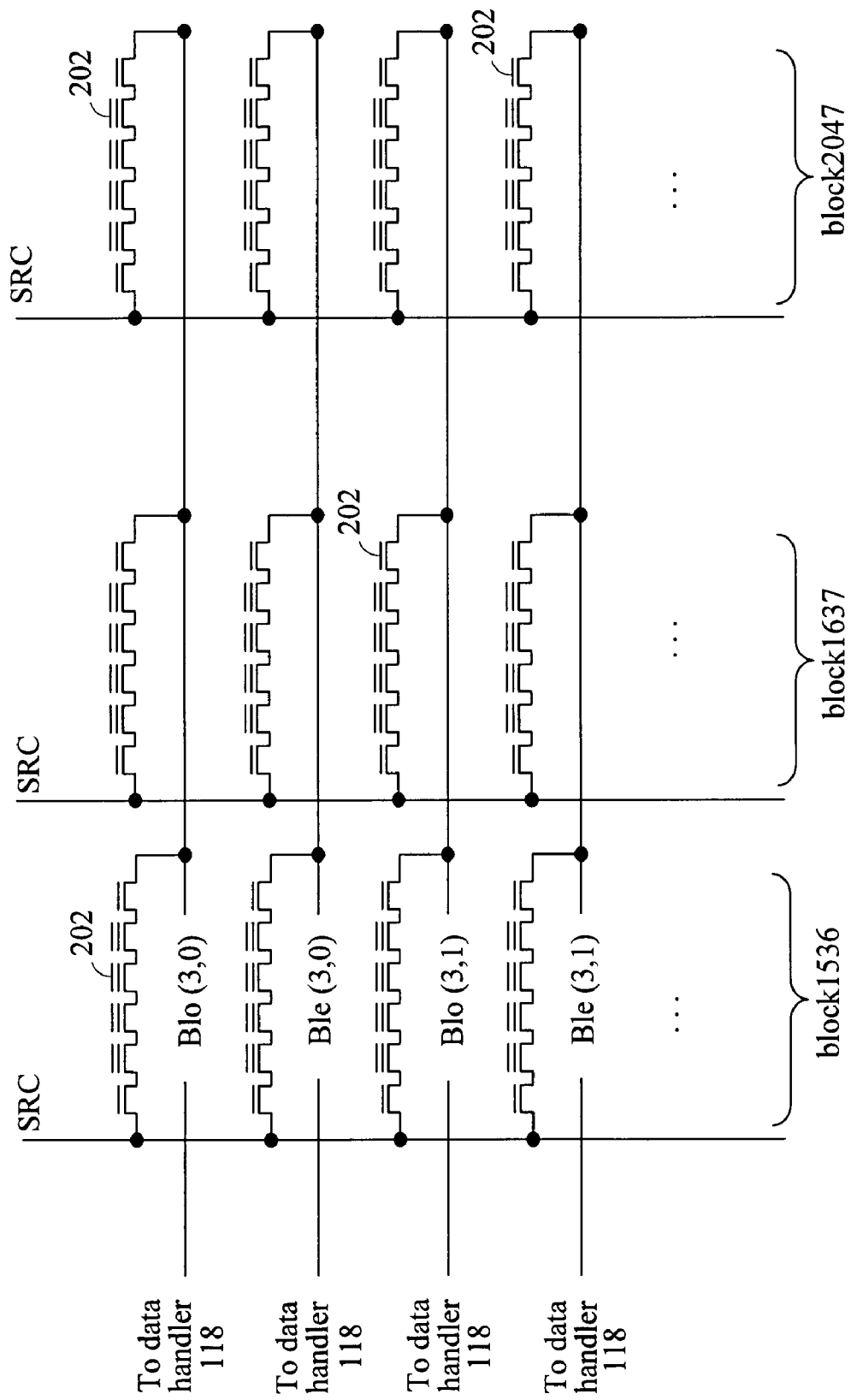
FIG. 2D is a schematic diagram illustrating a memory segment 108 of the flash memory array of FIG. 1, according to an exemplary embodiment of the present disclosure.

FIG. 2D illustrates a schematic diagram of the memory segment 108, according to an exemplary embodiment of the present disclosure. The memory segment 108 is connected to the data handler 118. The memory segment 108 includes blocks starting from the block 1536 to the block 2047. These blocks are connected in a serial manner and the sources of the transistors 202 are connected to the common line 'SRC' in a similar fashion as the memory segment 102, explained in conjunction with FIG. 2A.

As shown in FIG. 2D, the memory segment 108 comprises common bitlines BLo (3, 0), BLe (3, 0), BLo (3, 1) and BLe (3, 1) for the block 1536 to the block 2047. The BLo (3, 0) may represent a first odd bitline of the memory segment 108 and the BLe (3, 0) may represent a first even bitline of the memory segment 108. Similarly, the BLo (3, 1) may represent a second odd bitline of the memory segment 108 and the BLe (3, 1) may represent a second even bitline of the memory segment 108. As shown in FIG. 2D, the bitlines BLo (3, 0), BLe (3, 0), BLo (3, 1) and BLe (3, 1) of the memory segment 108 are connected to the data handler 118. When the memory segment 108 is selected for the read operation, the selected bitlines of the memory segment 108 are sensed by the data handler 118, which is further described in conjunction with FIG. 4B.

Figure 3A:
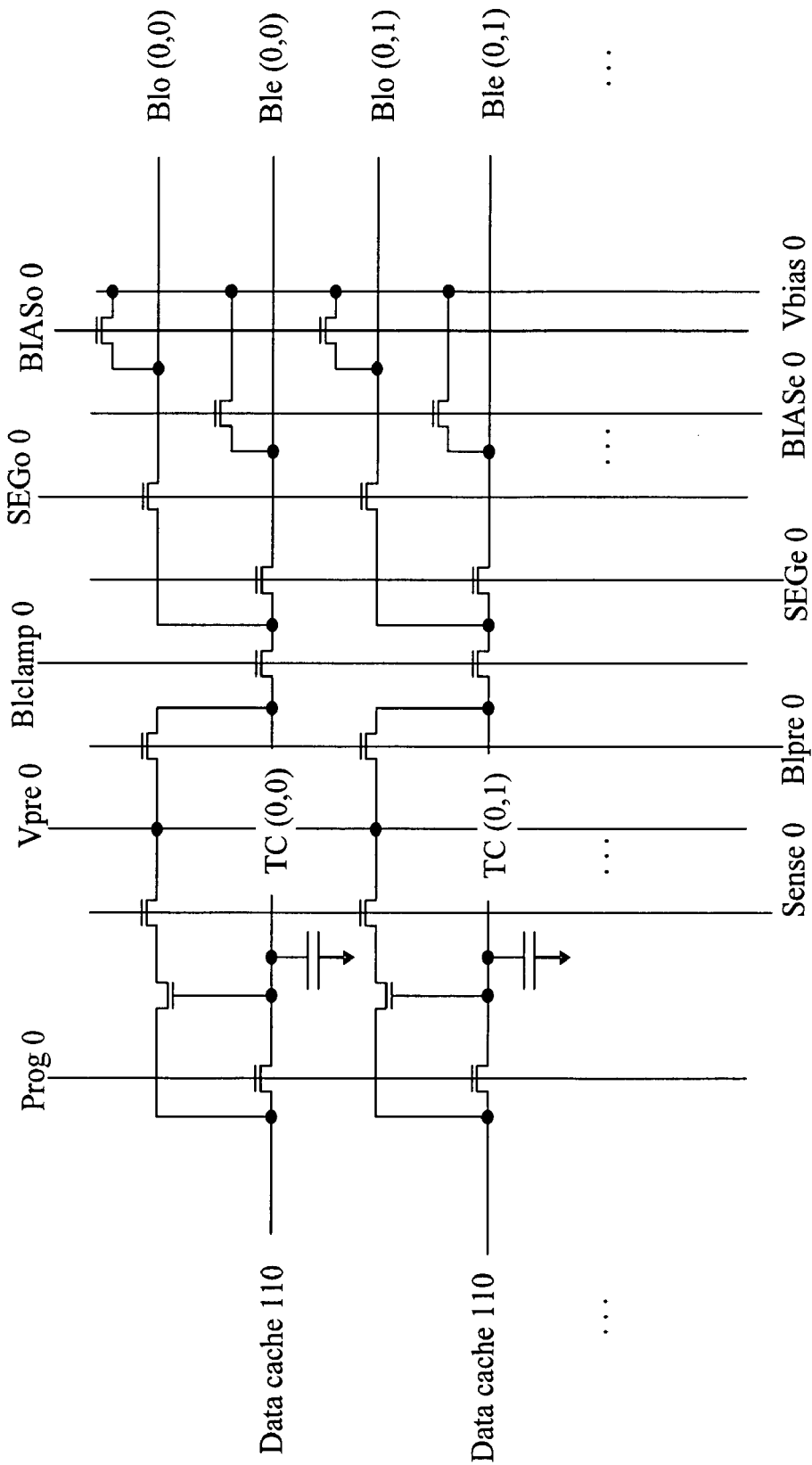
FIG. 3A is an abbreviated schematic diagram of a data handler 112 of the flash memory array of FIG. 1, in accordance with an exemplary embodiment of the present disclosure.

Referring now to FIG. 3A, an abbreviated schematic diagram of the data handler 112 is shown, in accordance with an exemplary embodiment of the present disclosure. The data handler 112 is coupled between the data cache 110 and the memory segment 102. The data handler 112 is configured to condition bitlines of the memory segment 102. The conditioning the bitlines comprises pre-charging the bitlines to a pre-charge voltage level. The reference voltage may be a ground voltage or any fixed low voltage level. The data handler 112 is also configured to sense the read data from the selected bitline of a memory segment of the pair of memory segment and transmit the sensed read data to the data cache 110. More specifically, the data handler 112 is capable of pre-charging, shielding and sensing the bitlines of the memory segment 102. In case the read operation is to be performed on the memory segment 102, the selected bitlines of the memory segment 102 are sensed and the sensed read data is transmitted to the data cache 110.

The above functionalities of the data handler 112 will be explained further in conjunction with FIGS. 4A, 4B and 4C. As shown in FIG. 3A, the data handler 112 comprises a plurality of lines such as a prog (0) line, a sense (0) line, a vpre (0) line, a blclamp (0) line, an SEGe (0), an SEGe (0) line, a BIASe (0) line, a blpre (0) line, a BIASo (0) line and a Vbias (0) line. It will be appreciated that for the sake of simplicity, 0 as a suffix is used with the plurality of lines of the data handler 112, as the data handler 112 perform the above mentioned functionalities on the memory segment 102, which is a first memory segment of the flash memory array 100. These lines are appropriately biased in order to perform the pre-charge phase, the sense phase and the transmission phase of the read operation. The operation of these lines will be explained in conjunction with FIGS. 4A, 4B and 4C, and FIG. 8

Figure 3B:
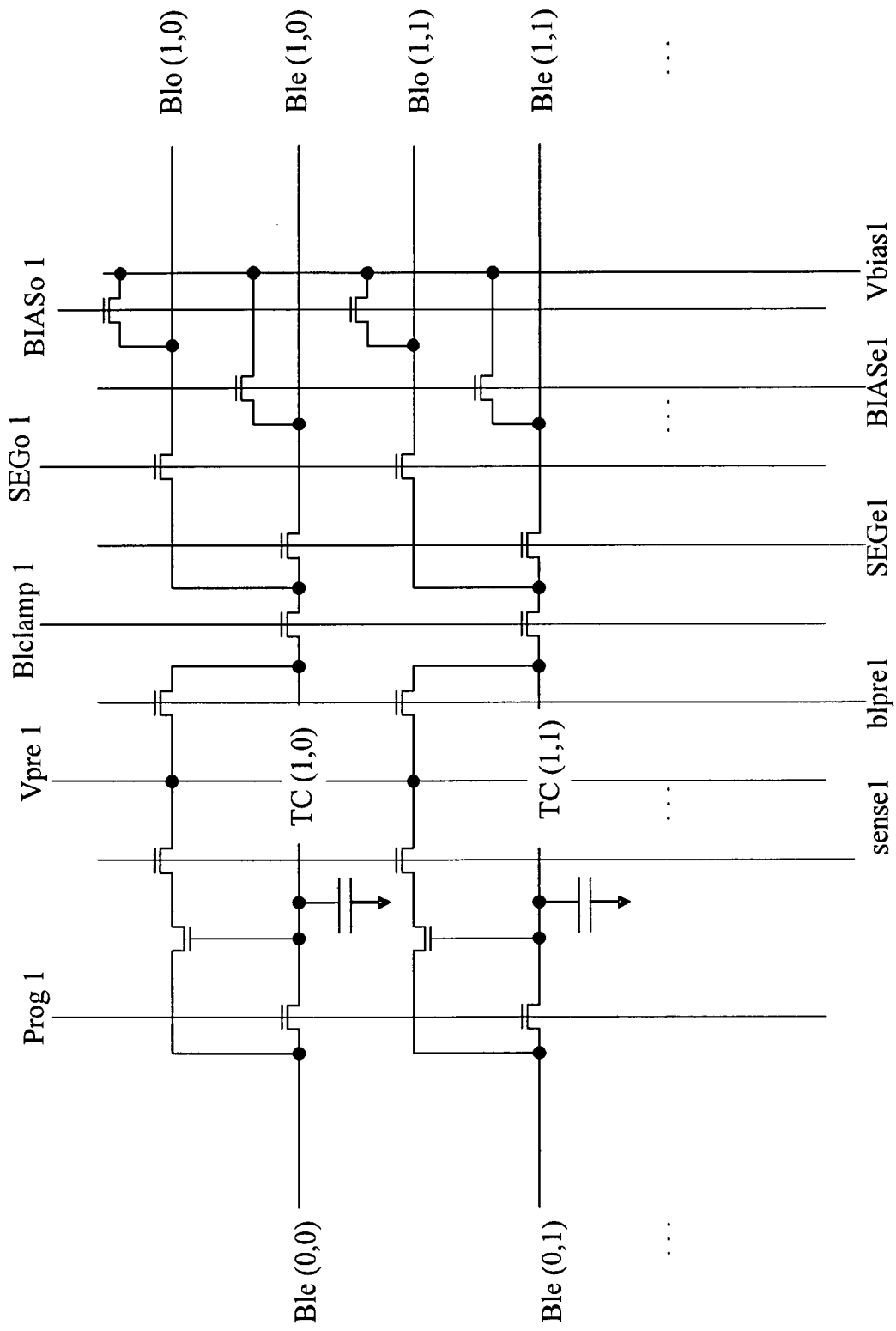
FIG. 3B is an abbreviated schematic diagram of a segment data handler 114 of the flash memory array of FIG. 1, in accordance with an exemplary embodiment of the present disclosure.

Referring now to FIG. 3B, an abbreviated schematic diagram of the data handler 114 is shown, in accordance with an exemplary embodiment of the present disclosure. The data handler 114 is coupled between a pair of memory segments 102 and 104. The data handler 114 is configured to pre-charge the selected bitlines, sense the read data from the selected bitline of a memory segment of the pair of memory segments and further transmit the sensed read data to the data cache 110. More specifically, the data handler 114 is capable of pre-charging, shielding and sensing the bitlines of the memory segment 104. In case the read operation is to be performed on the memory segment 104, the selected bitlines of the memory segment 104 are sensed and sensed read data is transmitted to the data cache 110.

The above functionalities of the data handler 114 will be explained further in conjunction with FIGS. 4A, 4B and 4C. As shown in FIG. 3B, the data handler 114 comprises a plurality of lines such as a prog (1) line, a sense (1) line, a vpre (1) line, a blclamp (1) line, an SEGe (1), an SEGe (1) line, a BIASe (1) line, a blpre (1) line, a BIASo (1) line and a Vbias (1) line. It will be appreciated that for the sake of simplicity, 1 as a suffix is used with the plurality of lines, as the data handler 114 performs these functionalities on the memory segment 104, which is a second memory segment of the flash memory array 100. These lines are appropriately biased in order to perform the pre-charge phase, the sense phase and the transmission phase of the read operation. The operation of these lines will be explained in conjunction with FIGS. 4A, 4B and 4C, and FIG. 8.

Figure 3C:
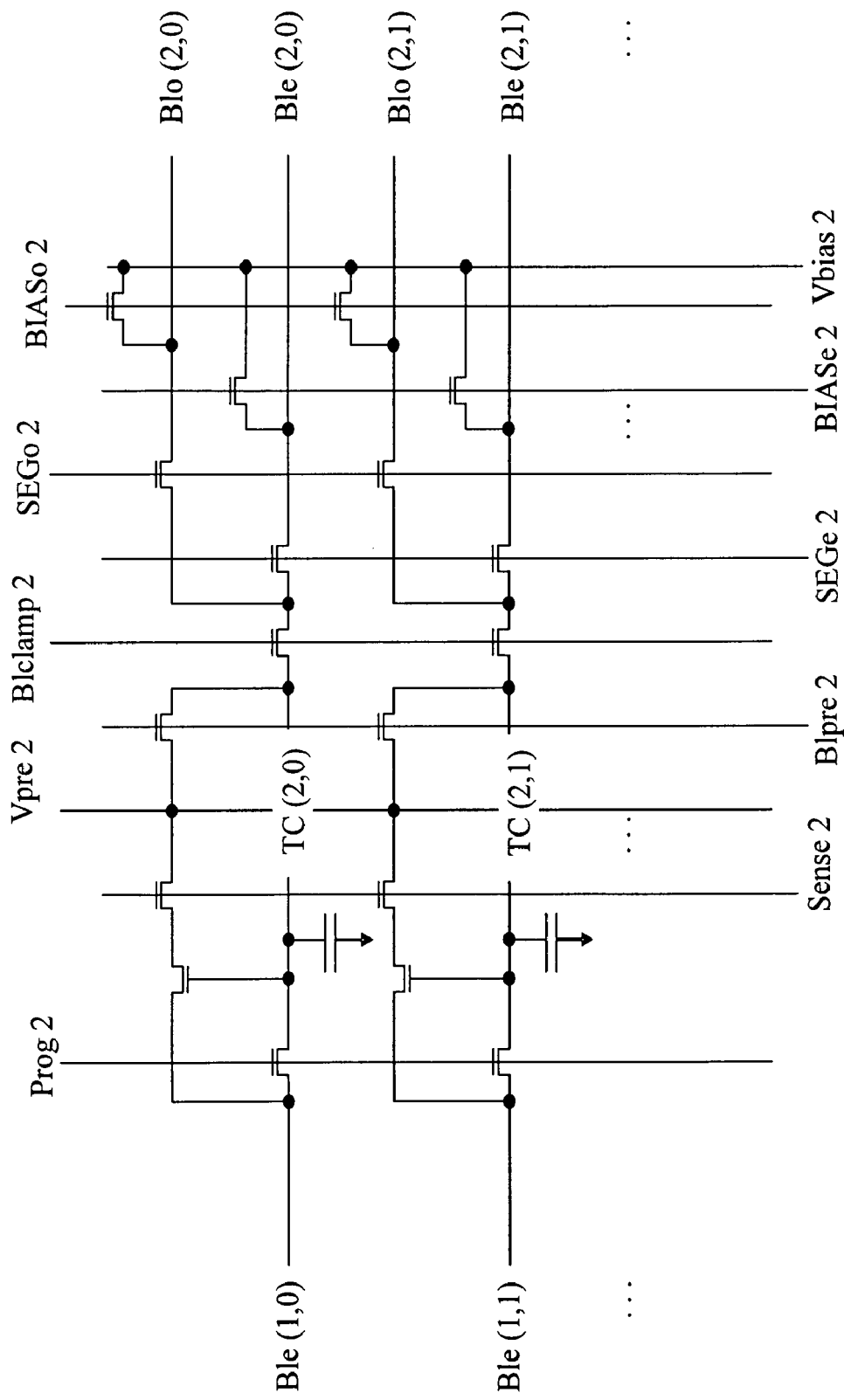
FIG. 3C is an abbreviated schematic diagram of a segment data handler 116 of the flash memory array of FIG. 1, in accordance with an exemplary embodiment of the present disclosure.

Referring now to FIG. 3C, an abbreviated schematic diagram of the data handler 116 is shown, in accordance with an exemplary embodiment of the present disclosure. The data handler 116 is coupled between the pair of memory segments, the memory segment 104 and the memory segment 106. The data handler 116 is configured to pre-charge the selected bitlines, sense the read data from the selected bitline of the memory segment of the pair of memory segments and further transmit the sensed read data to the data cache 110. More specifically, the data handler 116 is capable of pre-charging, shielding and sensing the bitlines of the memory segment 106. In case the read operation is to be performed on the memory segment 106, the selected bitlines of the memory segment 106 are sensed and the sensed read data is transmitted to the data cache 110.

The above functionalities of the data handler 116 will be explained further in conjunction with FIGS. 4A, 4B and 4C. As shown in FIG. 3C, the data handler 116 comprises a plurality of lines such as a prog (2) line, a sense (2) line, a vpre (2) line, a blclamp (2) line, an SEGe (2), an SEGe (2) line, a BIASe (2) line, a blpre (2) line, a BIASo (2) line and a Vbias (2) line. For the sake of simplicity, 2 as a suffix is used with the plurality of lines, as the data handler 116 performs these functionalities on the memory segment 106, which is a third memory segment of the flash memory array 100. These lines are appropriately biased in order to perform the pre-charge phase, the sense phase and the transmission phase of the read operation. The operation of these lines will be explained in conjunction with FIGS. 4A, 4B and 4C, and FIG. 8.

Figure 3D:
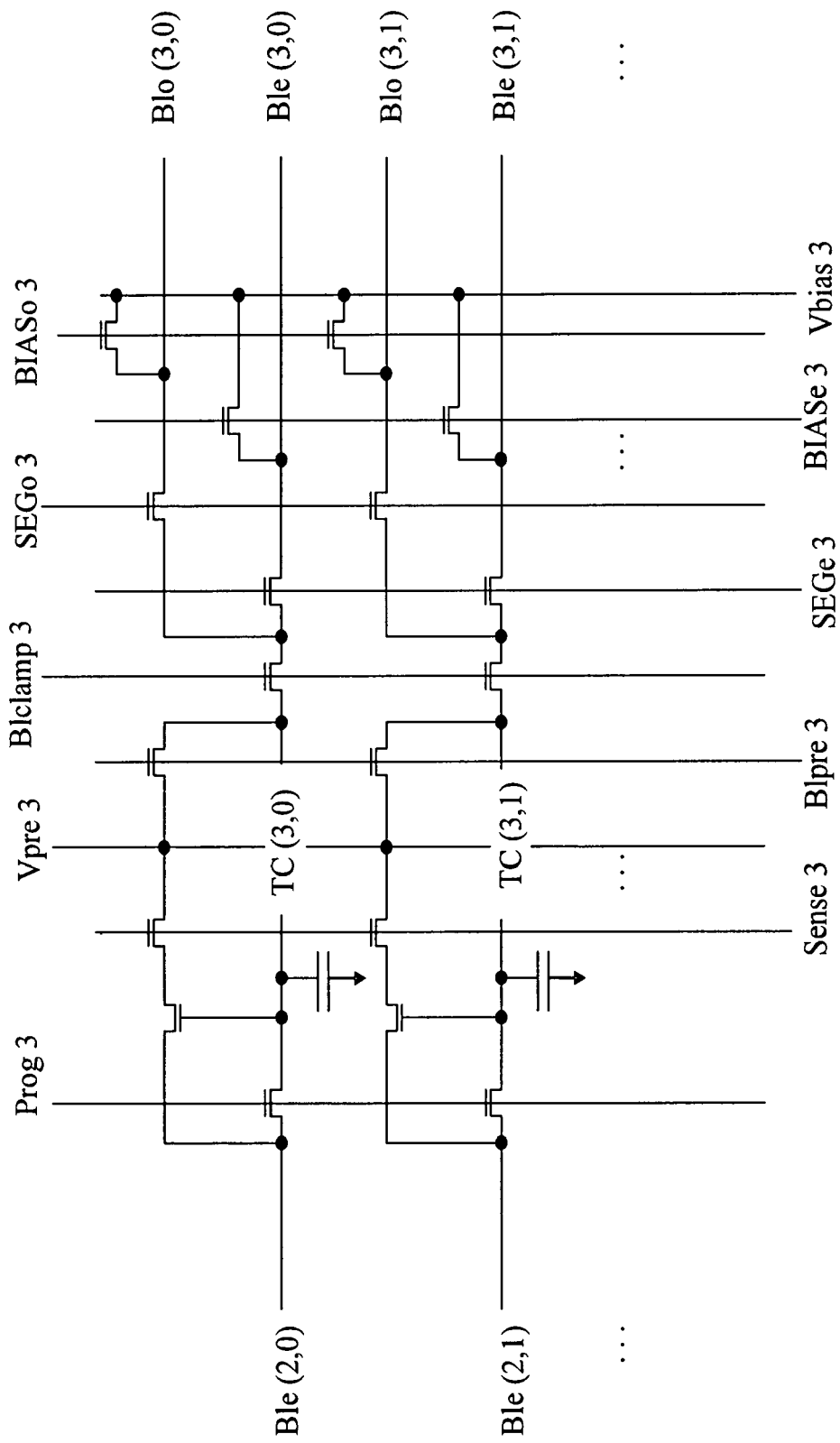
FIG. 3D is an abbreviated schematic diagram of a segment data handler 118 of the flash memory array of FIG. 1, in accordance with an exemplary embodiment of the present disclosure.

Referring now to FIG. 3D, an abbreviated schematic diagram of the data handler 118 is shown, in accordance with an exemplary embodiment of the present disclosure. The data handler 118 is coupled between the pair of memory segments, the memory segment 106 and the memory segment 108. The data handler 118 is configured to pre-charge the selected bitlines, sense the read data from the selected bitline of the memory segment of the pair of memory segments and further transmit the sensed read data to the data cache 110. More specifically, the data handler 118 is capable of pre-charging, shielding and sensing the bitlines of the memory segment 108. In case the read operation is to be performed on the memory segment 108, the selected bitlines of the memory segment 108 are sensed and sensed read data is transmitted to the data cache 110.

The above functionalities of the data handler 118 will be explained further in conjunction with FIGS. 4A, 4B and 4C. As shown in FIG. 3D, the data handler 118 comprises a plurality of lines such as a prog (3) line, a sense (3) line, a vpre (3) line, a blclamp (3) line, an SEGe (3), an SEGe (3) line, a BIASe (3) line, a blpre (3) line, a BIASo (3) line and a Vbias (3) line. For the sake of simplicity of the description, 3 as a suffix is used with the plurality of lines, as the data handler 118 performs these functionalities on the memory segment 108, which is a fourth memory segment of the flash memory array 100. These lines are appropriately biased in order to perform the pre-charge phase, the sense phase and the transmission phase of the read operation. The operation of these lines will be explained in conjunction with FIGS. 4A, 4B and 4C, and FIG. 8.

Figure 4A:
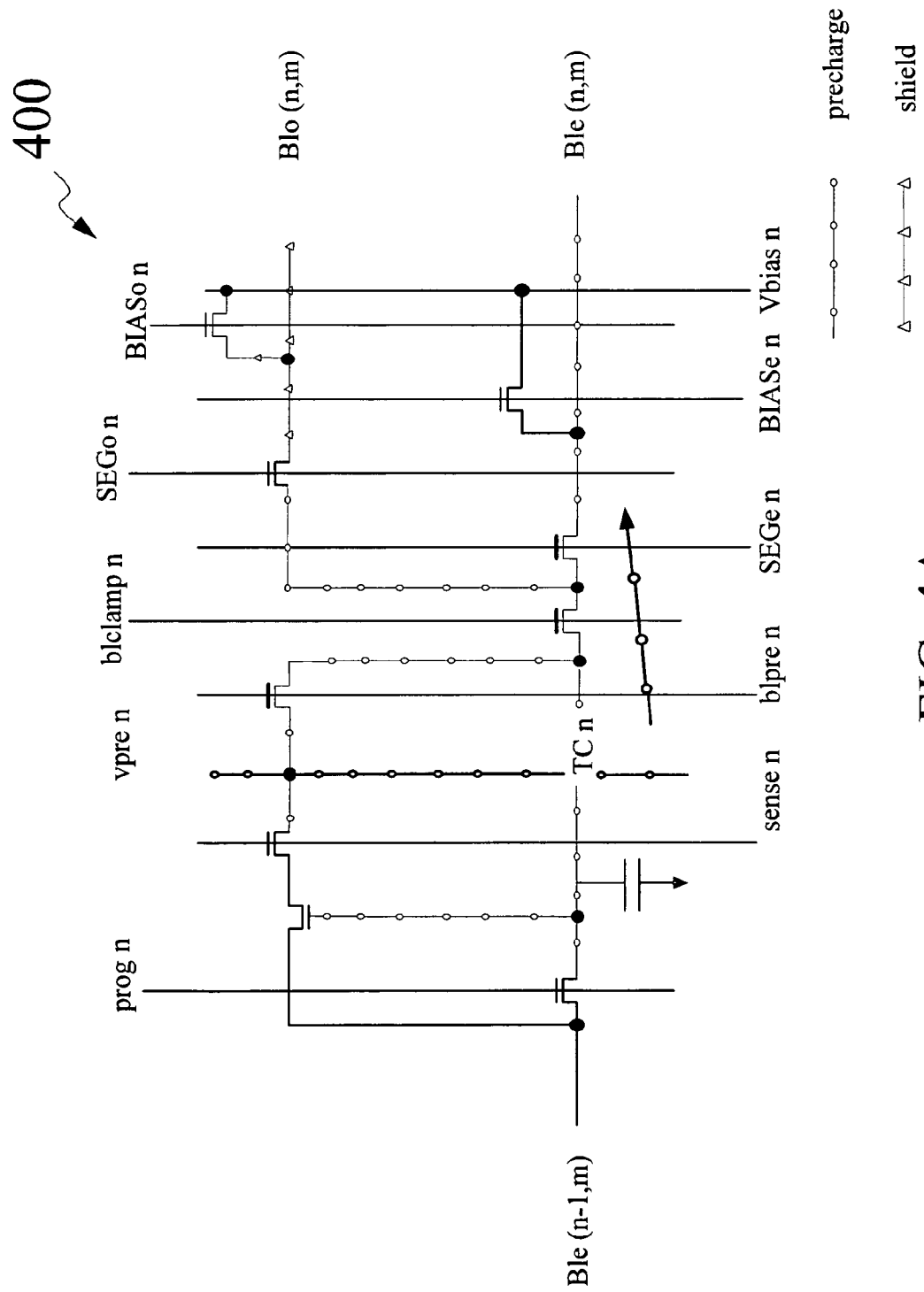
FIG. 4A is an abbreviated schematic diagram illustrating a pre-charge phase of a segment data handler 400, in accordance with an exemplary embodiment of the present disclosure.

Referring now to FIG. 4A, an abbreviated schematic diagram of a data handler 400 illustrating a pre-charge phase is shown, in accordance with an exemplary embodiment of the present disclosure. Herein, the data handler 400 will be described as an exemplary data handler and its description may be applied to any of the data handler such as the data handlers 112, 114, 116 and 118. As already discussed, the selected bitlines of the selected memory segment for the read operation are pre-charged and the non-selected bitlines are shielded at a ground potential.

With reference to the FIG. 4A, the pre-charging functionality of the data handler 400 may be explained. As shown in FIG. 4A, the data handler 400 comprises a plurality of lines such as a prog (n) line, a sense (n) line, a vpre (n) line, a blclamp (n) line, an SEGe (n) line, an SEGo (n) line, a BIASe (n) line, a BIASo (n) line, a blpre (n) line and a Vbias (n) line. It should be noted that these lines are same as the corresponding lines discussed in conjunction with FIGS. 3A, 3B, 3C and 3D, when n=0, 1, 2 and 3 respectively. For the sake of simplicity, the lines of the data handler 400 involved in the pre-charging of the selected bitline is shown as lines with circles and lines involved in the shielding of the non-selected bitline is shown as lines with triangles.

The data handler 400 is coupled between an element n−1 and an element n. The elements n−1 and n can be any one of the data cache 110 and the memory segments 102, the memory segment 102 and the memory segment 104, the memory segment 104 and the memory segment 106, and the memory segment 106 and the memory segment 108, respectively. The data handler 400 is connected to bitlines BLo (n, m) and BLe (n, m) of the element n and to a bitline BLe (n−1, m) of the element n−1. The BLo (n, m) represents the $m^{th}$ odd bitline of the $n^{th}$ element. Similarly, The BLe (n, m) represents the $m^{th}$ even bitline of the $n^{th}$ element and the BLe (n−1, m) represents the $m^{th}$ even bitline of the $(n−1)^{th}$ element. For the purpose of simplicity, only two bitlines BLo (n, m) and BLe (n, m) are shown in the element n and a single bitline BLe (n−1, m), and it should not be considered limiting.

The data handler 400 pre-charges the selected bitlines of the selected memory segment for the read operation. Considering a case when the selected memory segment is the element n and the selected bitline is the BLo (n, m), the vpre (n) line, the blclamp (n) line, the SEGe (n) line, an SEGo (n) line, the BIASe (n) line, the BIASo (n) line, the blpre (n) line and the Vbias (n) line are applied certain voltages to pre-charge the selected bitline. Let the selected bitline is the bitline BLe (n, m). For example, the lines BIASo (n) line, blclamp (n) and blpre (n) are kept at a positive voltage level to pre-charge the BLo (n, m), while the line BIASe (n) line is kept at a ground potential to shield a non-selected bitline BLo (n, m) of the element n. Further, the line SEGe (n) is kept at a high logic level and the SEGo (n) is at ground potential to allow the BLe (n, m) to be pre-charged and the BLo (n, m) to be shielded at the ground potential. The pre-charge phase functionality of the data handler 400 is further explained in conjunction with FIG. 8, where the read operation will be discussed in details.

Figure 4B:
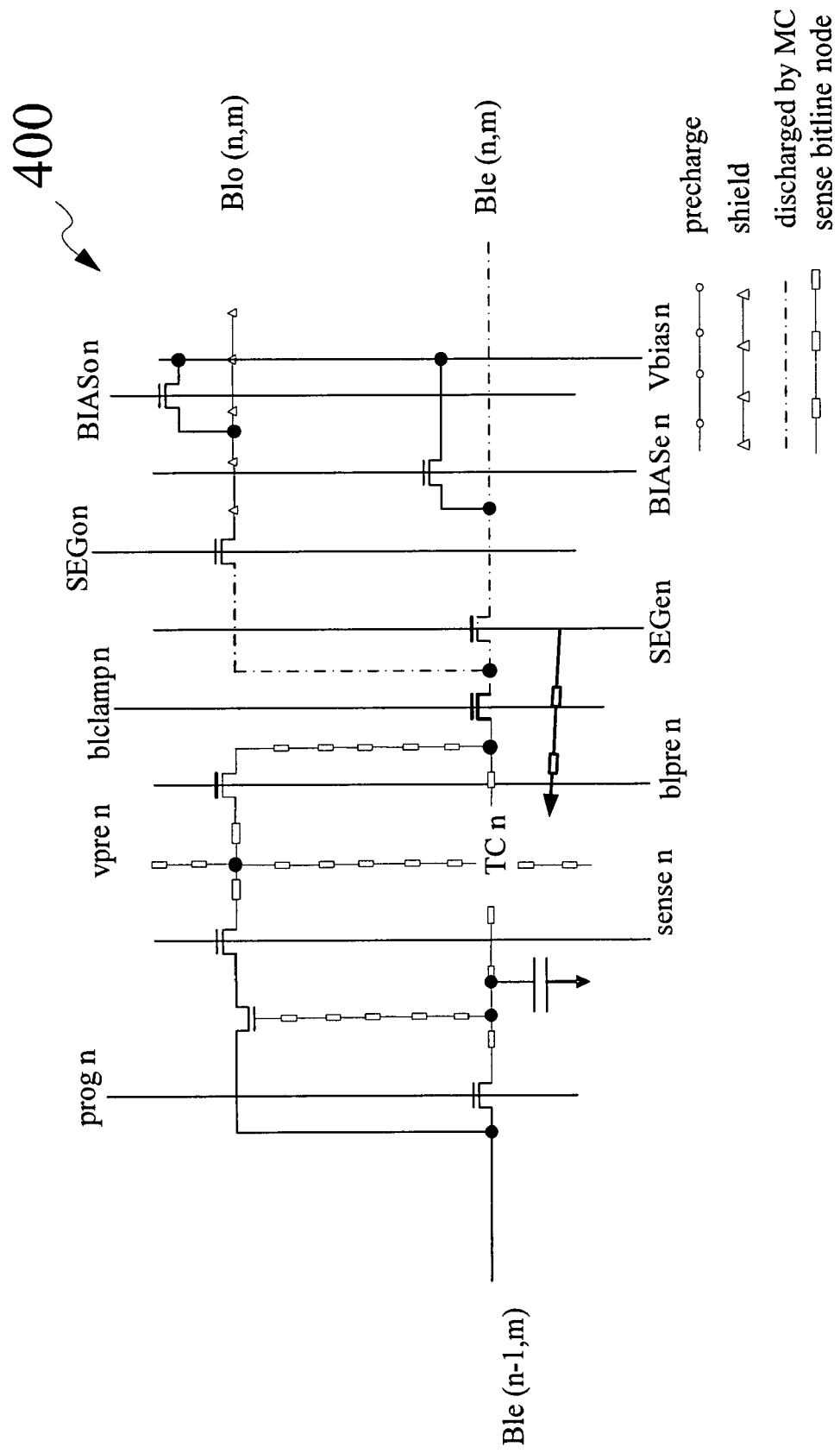
FIG. 4B is an abbreviated schematic diagram illustrating a sense phase of the data handler 400, in accordance with an exemplary embodiment of the present disclosure.

Referring now to FIG. 4B, an abbreviated schematic diagram of the data handler 400 illustrating the sense phase of the read operation is shown, in accordance with an exemplary embodiment of the present disclosure. The data handler 400 senses the selected bitlines of the selected memory segment after the pre-charge phase of the selected bitlines. Sense phase comprises discharging of the selected bitline, which is pre-charged by the memory cell (MC) followed by sensing the voltage level of the selected bitline in the TC (n) node of the data handler 400.

For the sake of simplicity, the lines of the data handler 400 involved in discharging the BLe (n, m) are represented by lines with dashes and lines involved in the sensing of the voltage level of the BLe (n, m) are represented by lines with rectangles. As shown in FIG. 4B, the BLe (n, m) is discharged by corresponding MC and the voltage level of the BLe (n, m) is sensed into the TC (n) node of the data handler (shown by lines with rectangles in FIG. 4B). The sense phase of the read operation of the BLe (n, m) is further explained in conjunction with FIG. 8.

Figure 4C:
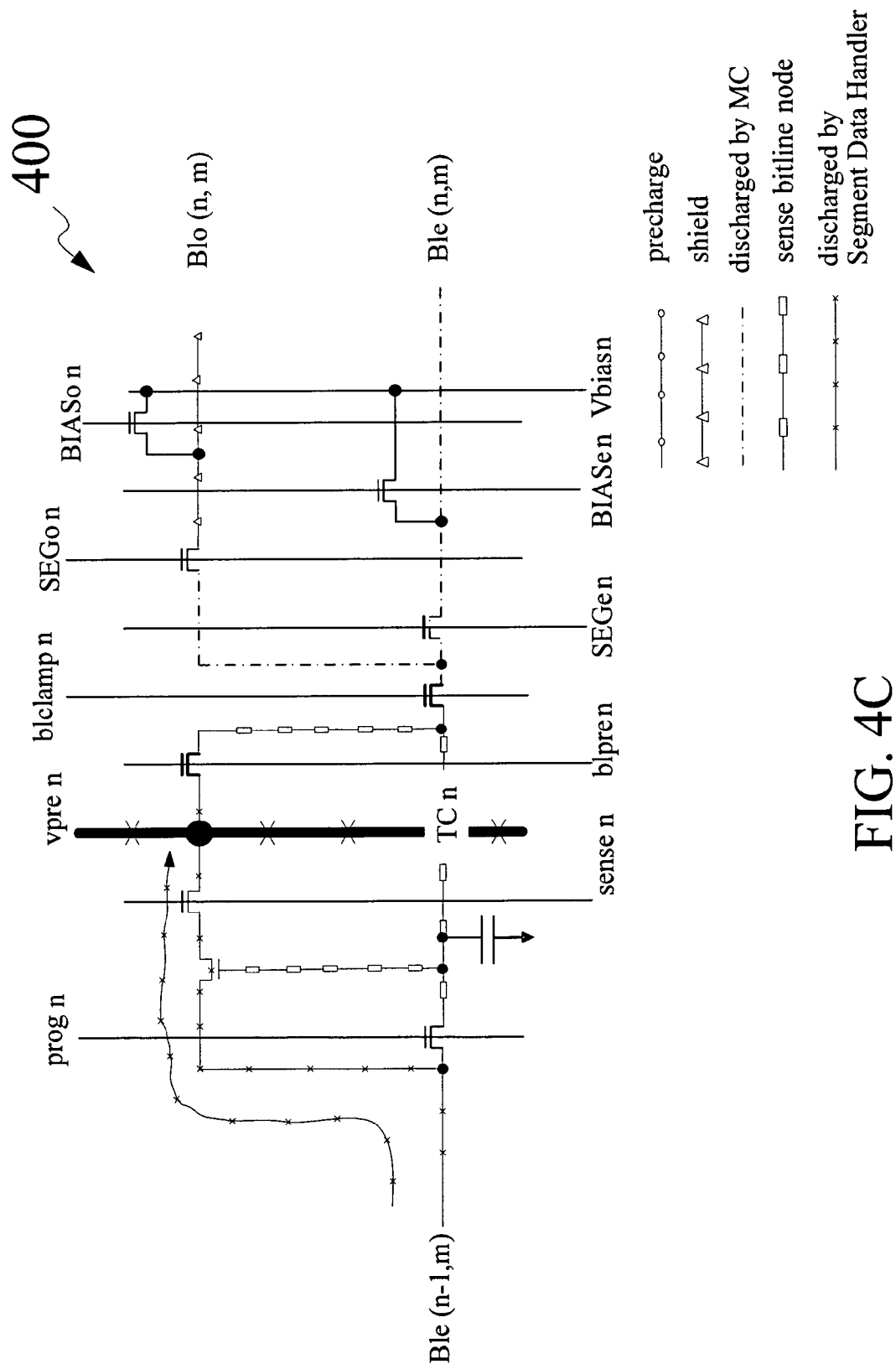
FIG. 4C is an abbreviated schematic diagram illustrating a transmit phase of the data handler 400, in accordance with an exemplary embodiment of the present disclosure.

Referring now to FIG. 4C, an abbreviated schematic diagram of the data handler 400 illustrating a transmit phase of the read operation is shown, in accordance with an exemplary embodiment of the present disclosure. The data handler 400 transmits the read data to the data cache 110 after sensing the read data from the selected bitlines of the selected memory segment. The data handler 400 transmits the read data to the data cache 110 in a sequential manner. More specifically, the data handler 400 transmits the read data to an adjacent data handler, which is between the data handler 400 and the data cache 110. The adjacent data handler further transmits the read data to its adjacent data handler and finally to the data cache 110.

For the sake of simplicity, the lines of the data handler 400 involved in transmitting the read data are represented by lines with crosses. Transmitting the read data to the adjacent data handler involves discharging or keeping at the high logic level to the bitlines of the adjacent memory segments and the adjacent data handlers. As shown in FIG. 4C, after the BLe (n, m) is sensed by the data handler 400, the read data is transmitted to a bitline BLe (n−1, m) of the adjacent memory segment and then to the data handler attached to the adjacent memory segment. The bitlines of the adjacent memory segment are either discharged or kept at the high logic level depending upon the sensed data that is read data.

As already discussed, the data handler senses the selected bitline in TC (n) node. In an embodiment of the present disclosure, the bitlines of the adjacent memory segment is discharged (shown by the arrow in the FIG. 4C), when the TC (n) is of the high logic level in order to transmit the read data to the adjacent memory segment. Accordingly, the bitlines of the adjacent memory element are kept at the high logic level when the TC (n) is of the low logic level.

The above described various phases of the read operation are further described in conjunction with FIGS. 5A, 5B, 5C, 5D, 5E, 5F and 5G. These figures represent the read operation of the selected bitlines of the memory segment 108.

Figure 5A:
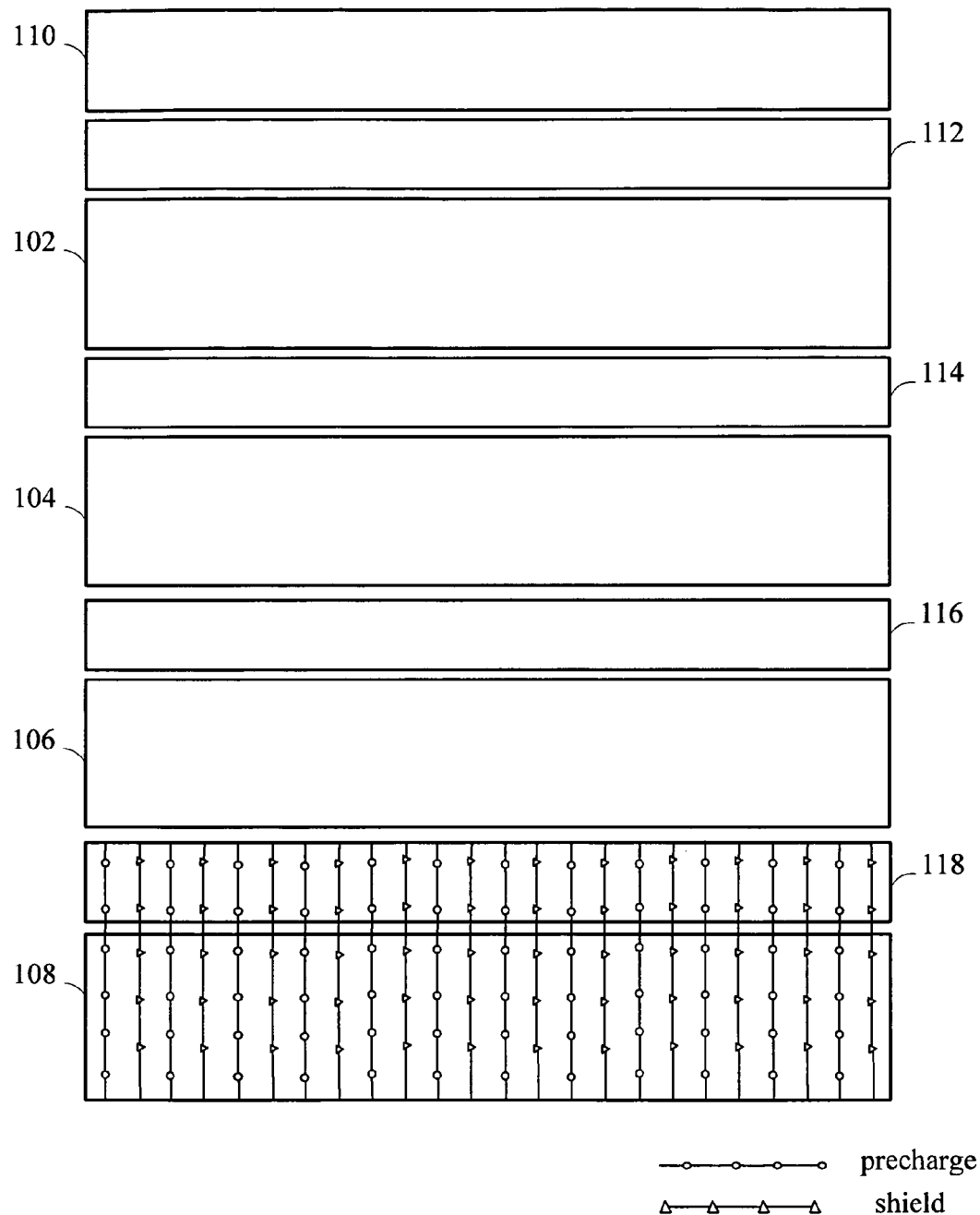
FIG. 5A is a schematic diagram of a pre-charge phase in the read operation in the memory array of FIG. 1, in accordance with an exemplary embodiment of the present disclosure.

Referring now to FIG. 5A, a schematic diagram of the pre-charge phase in the read operation is shown, in accordance with an exemplary embodiment of the present disclosure. As shown in FIG. 5A, to perform the read operation of the selected bitlines of the memory segment 108, the selected bitlines are pre-charged to the pre-charge voltage level. The pre-charging of the selected bitlines is represented by lines with circles. The other bitlines of the memory segment 108, which are non-selected bitlines, are shielded at the ground potential. The shielding of the non-selected bitlines is represented by lines with triangles.

Figure 5B:
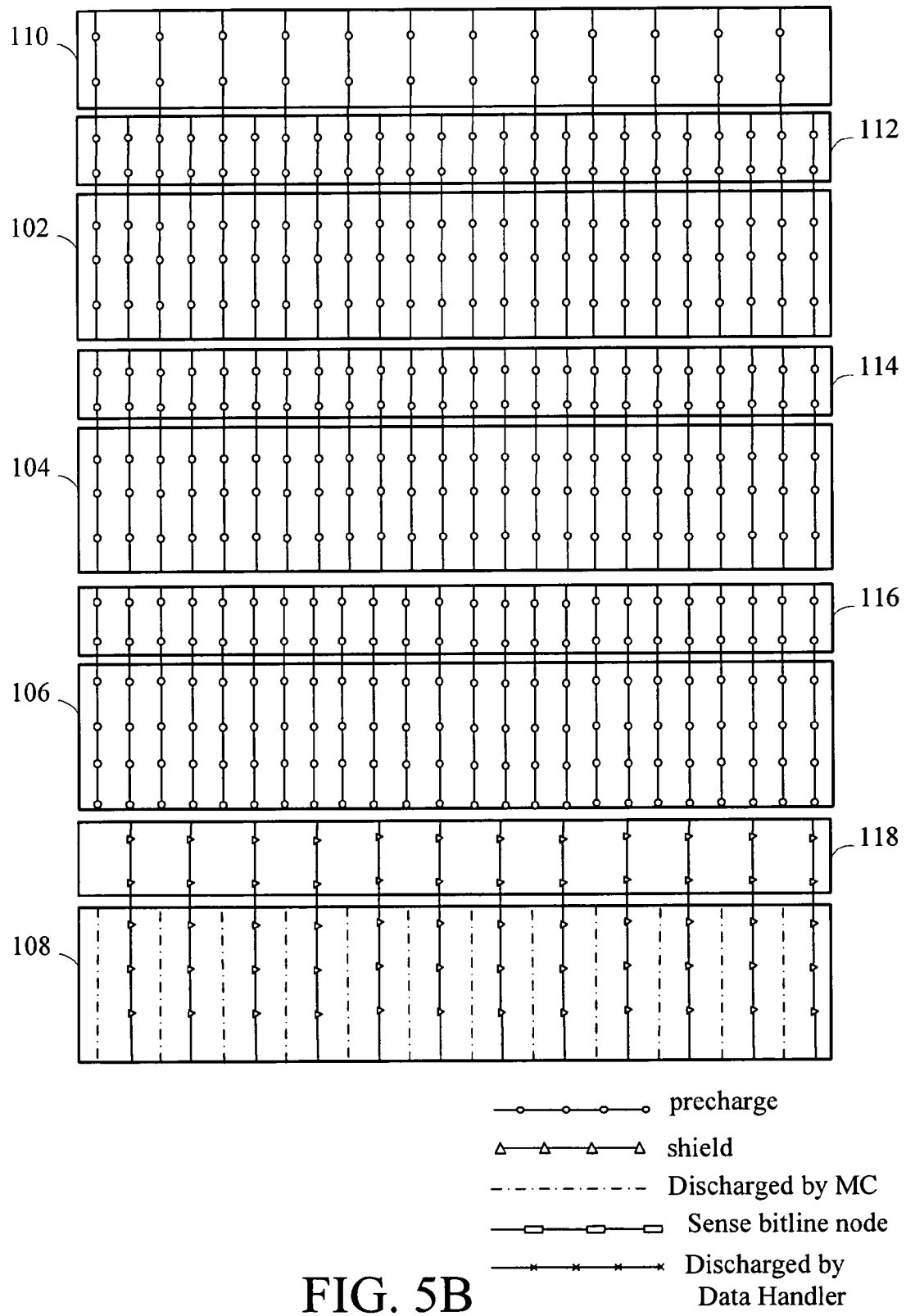
FIG. 5B is a schematic diagram of a develop phase in the read operation in the memory array of FIG. 1, in accordance with an exemplary embodiment of the present disclosure.

Referring now to FIG. 5B, a schematic diagram of a develop phase of the read operation is shown, in accordance with an exemplary embodiment of the present disclosure. The develop phase may be considered as a preparatory phase for the sense phase of the read operation. As shown in FIG. 5B, the selected bitlines of the memory segment 108 are discharged, as their corresponding MCs are erased. The discharging of the selected bitlines by the MCs is represented by lines in dashes in the FIG. 6B. At the same time, the bitlines of the other memory segments 102, 104 and 106 are pre-charged to the pre-charge voltage level.

Figure 5C:
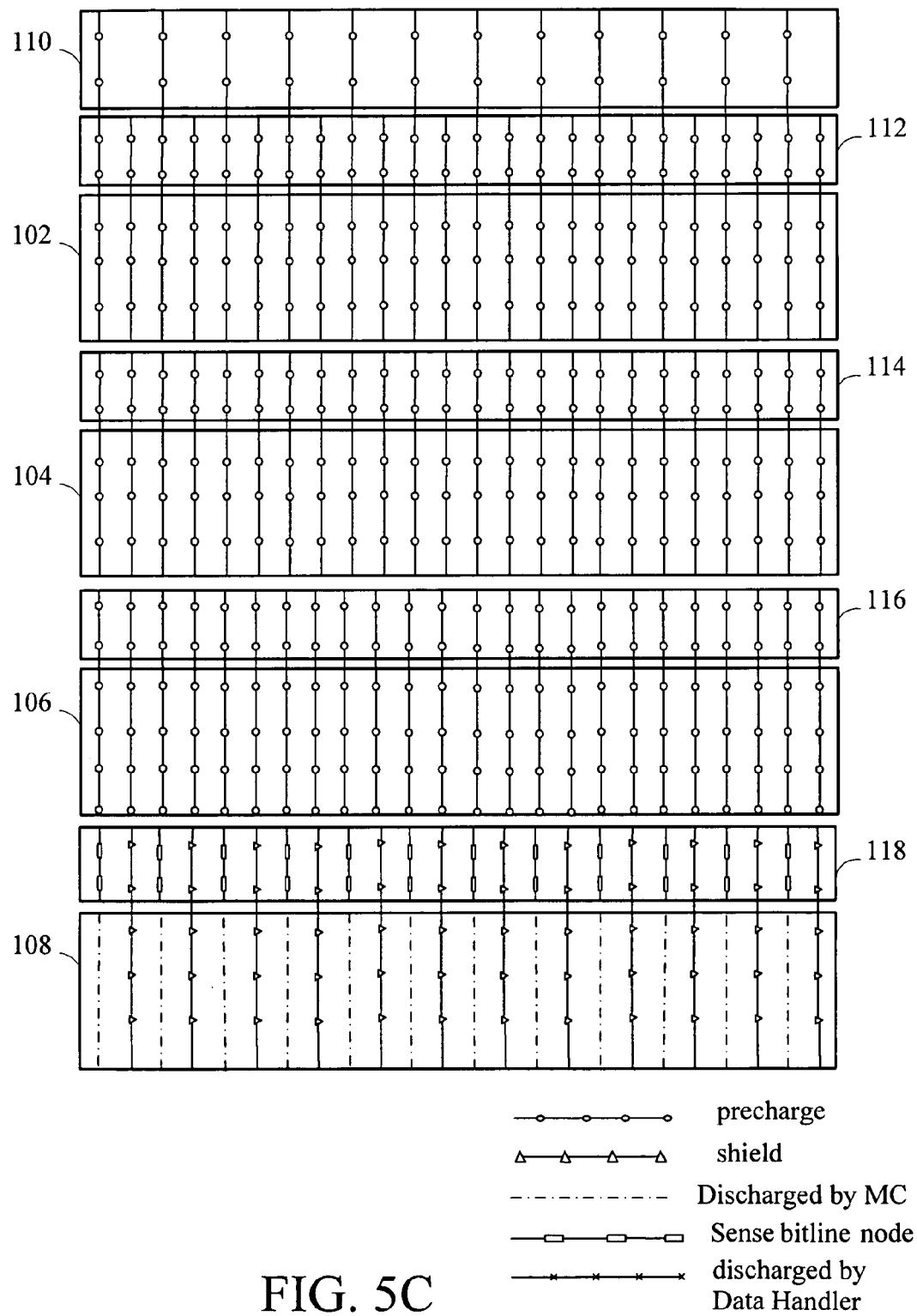
FIG. 5C is a schematic diagram of a sense phase in the read operation in the memory array of FIG. 1, in accordance with an exemplary embodiment of the present disclosure.

Referring now to FIG. 5C, a schematic diagram of a sense phase of the read operation is shown, in accordance with an exemplary embodiment of the present disclosure. As shown in FIG. 5C, the selected bitlines are sensed into the TC (3) node (see lines with rectangles in the data handler 118). Subsequently, the data handler 118 gets the read data corresponding to the selected bitlines of the memory segment 108.

Figure 5D:
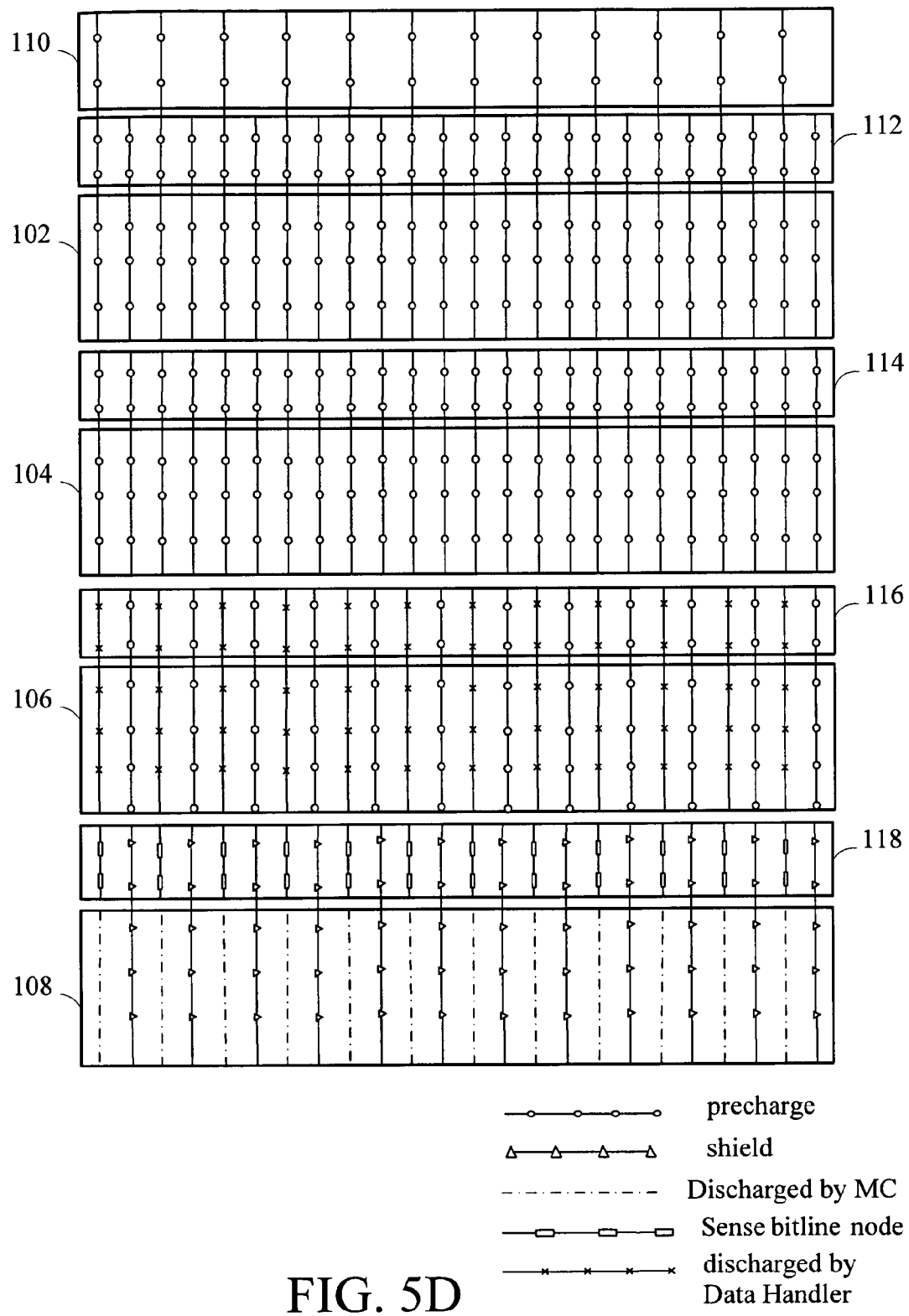
FIG. 5D is a schematic diagram of a of a transmit phase of the read operation where read data is transmitted from the segment data handler 118 to the segment data handler 116, in accordance with an exemplary embodiment of the present disclosure.

Referring now to FIG. 5D, a schematic diagram of a transmit phase of the read operation, where the read data is transmitted from the data handler 118 to the data handler 116, is shown, in accordance with an exemplary embodiment of the present disclosure. As shown in FIG. 5D, the bitlines of the memory segment 106, which are aligned with the selected bitlines of the memory segment 108 (hereinafter these bitlines may also be referred to as 'selected bitlines') are discharged, as the logic level of the TC (3) node is high. These selected bitlines of the memory segment 106 are discharged by the data handler 118. The selected bitlines of the memory segment 106, which are discharged by the data handler 118, are represented in lines with crosses. Further, the bitlines of the data handler 116 are also discharged with the discharging of the selected bitlines of the memory segment 106. More specifically, the read data is transmitted to the data handler 116 from the data handler 118.

Figure 5E:
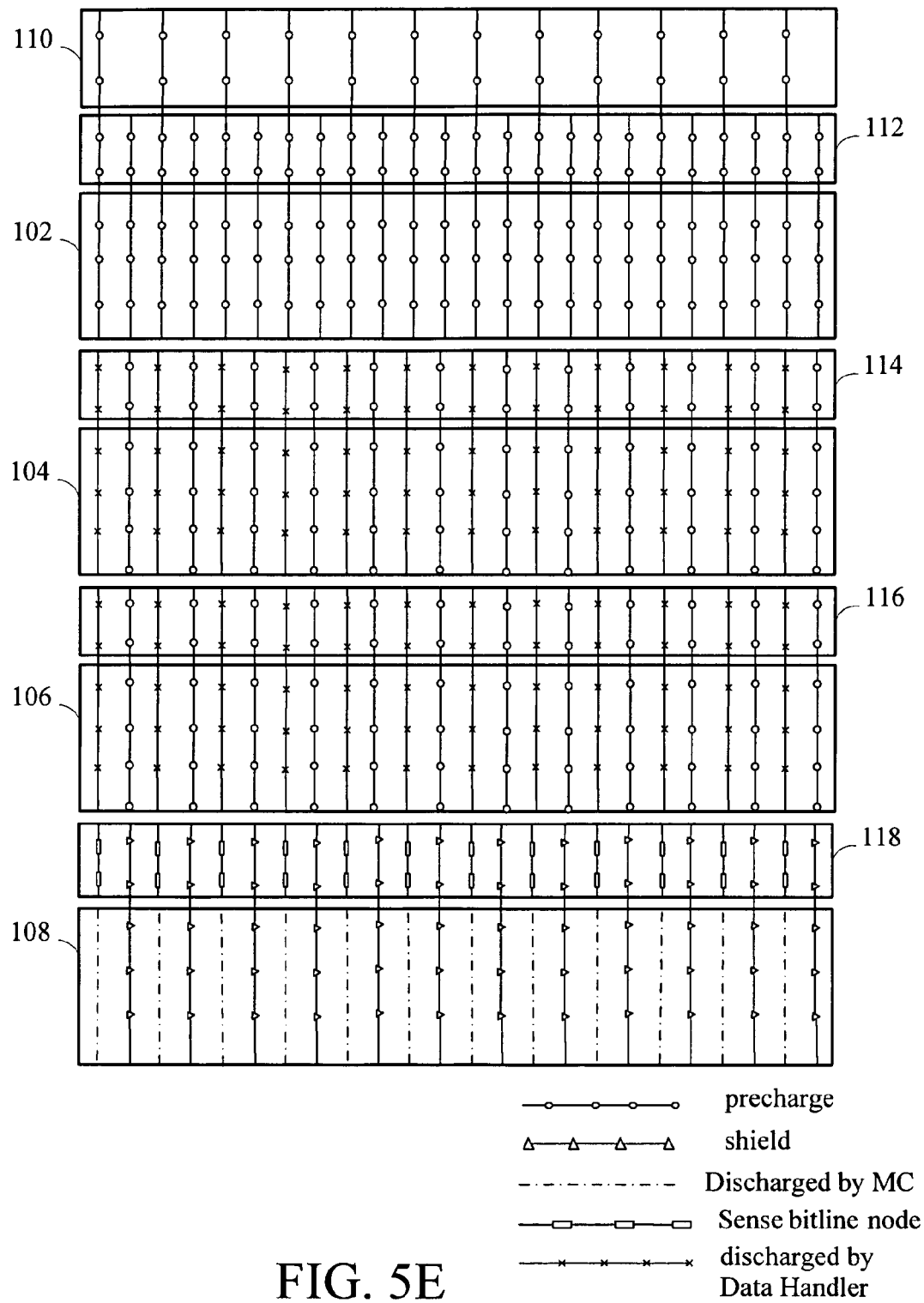
FIG. 5E is a schematic diagram of a of a transmit phase of the read operation where read data is transmitted from the segment data handler 116 to the segment data handler 114, in accordance with an exemplary embodiment of the present disclosure.

Further, referring to FIG. 5E, a schematic diagram of a transmit phase of the read data from the data handler 116 to the data handler 114 is shown, in accordance with an exemplary embodiment of the present disclosure. As shown in FIG. 5E, the selected bitlines of the memory segment 104 are discharged, as the logic level of the TC (2) node is high. These selected bitlines of the memory segment 104 are discharged by the data handler 116. Further, the bitlines of the data handler 114 are also discharged with the discharging of the selected bitlines of the memory segment 104. Consequently, the read data is transmitted to the data handler 114 from the data handler 116.

Figure 5F:
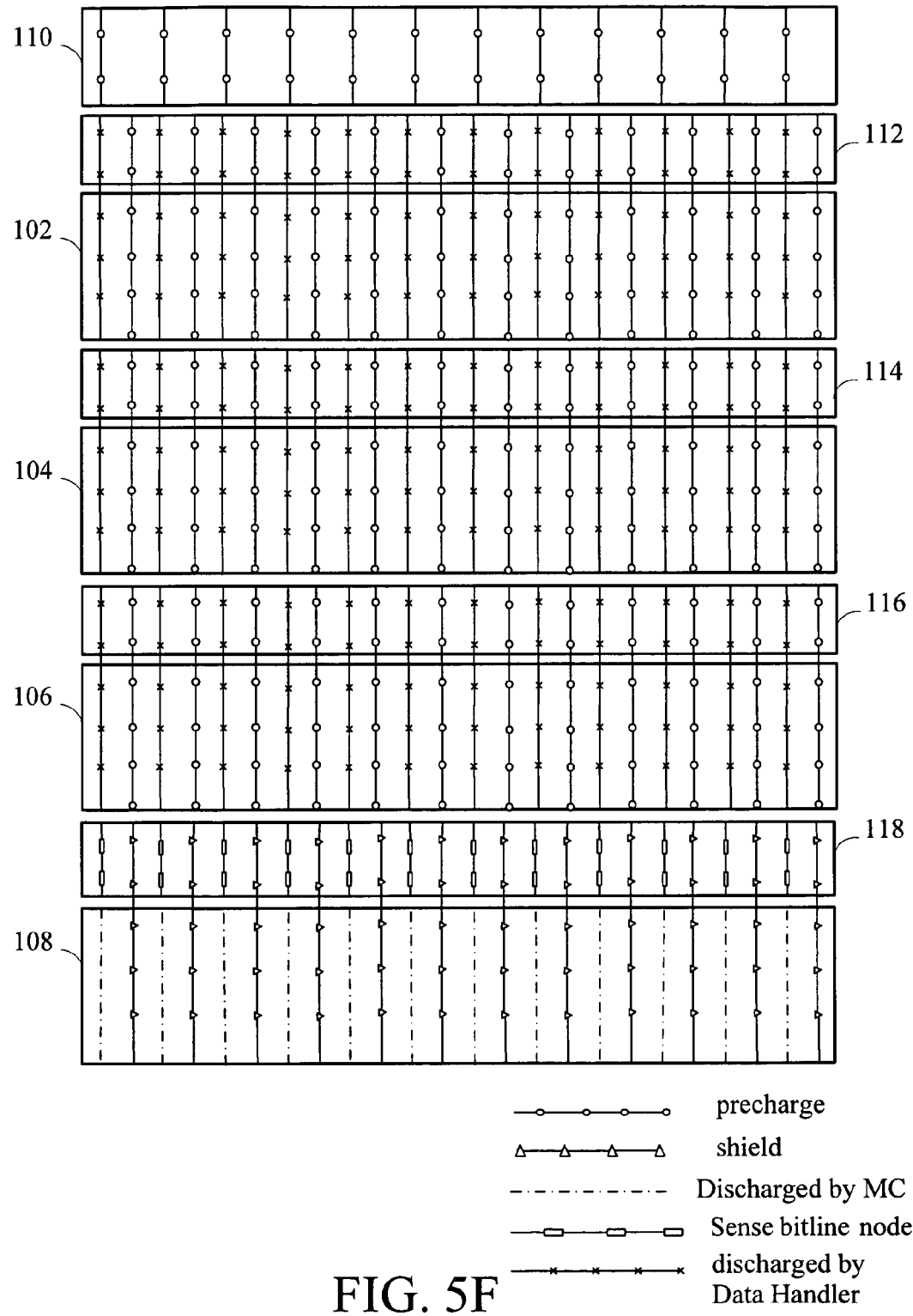
FIG. 5F is a schematic diagram of a of a transmit phase of the read operation where read data is transmitted from the segment data handler 114 to the segment data handler 112, in accordance with an exemplary embodiment of the present disclosure.

Referring now to FIG. 5F, a schematic diagram of a transmit phase of the read data from the data handler 114 to the data handler 112 is shown, in accordance with an exemplary embodiment of the present disclosure. As shown in FIG. 5F, the selected bitlines of the memory segment 102 are discharged, as the logic level of the TC (1) node is high. These selected bitlines of the memory segment 104 are discharged by the data handler 114. Further, the bitlines of the data handler 112 are also discharged with the discharging of the selected bitlines of the memory segment 102. Consequently, the read data is transmitted to the data handler 112 from the data handler 114.

Figure 5G:
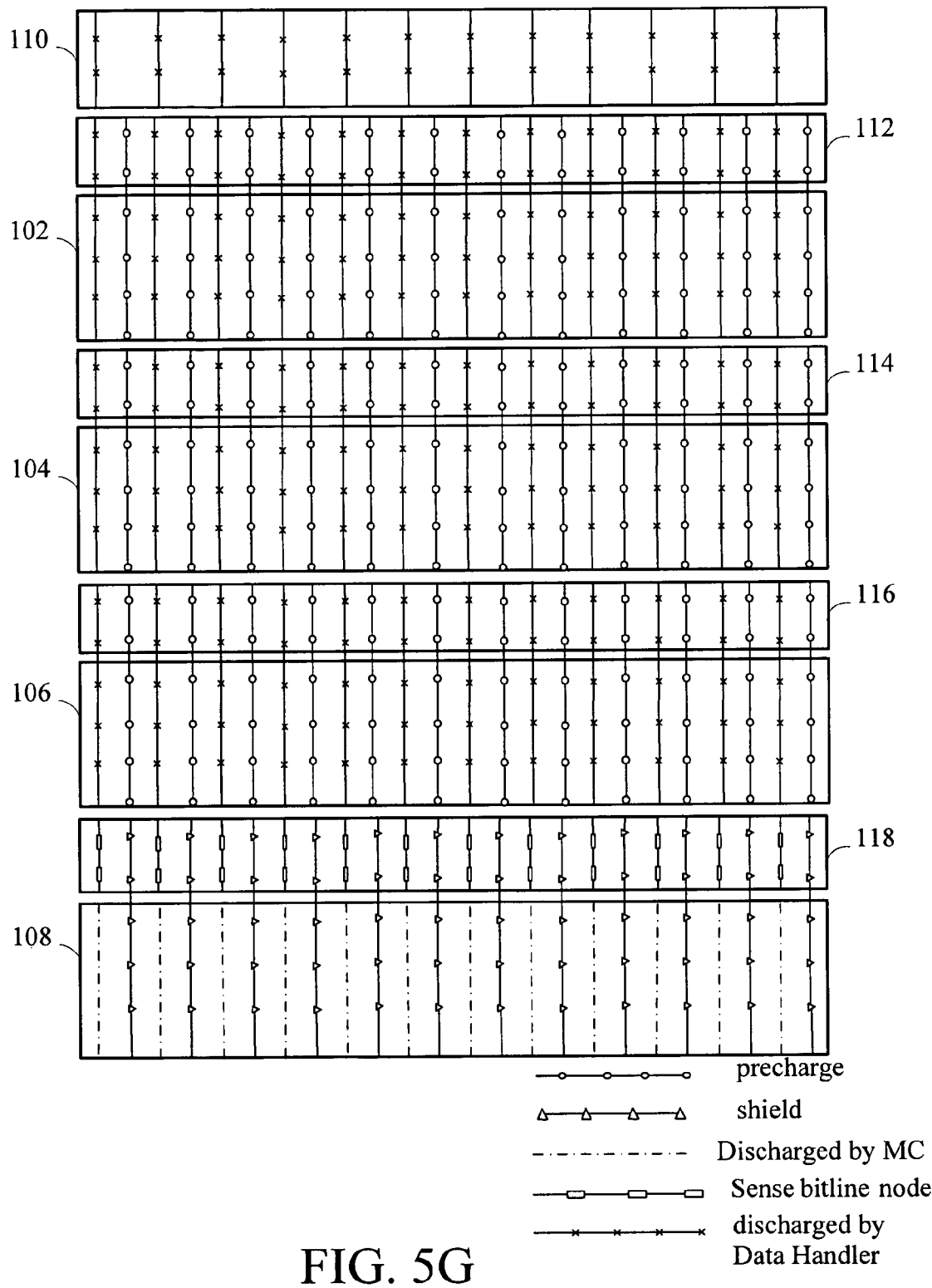
FIG. 5G is a schematic diagram of a of a transmit phase of the read operation where read data is transmitted from the segment data handler 112 to the data cache 110, in accordance with an exemplary embodiment of the present disclosure.

Further, FIG. 5G represents a schematic diagram of a transmit phase of the read data from the data handler 112 to the data cache 110, in accordance with an exemplary embodiment of the present disclosure. As shown in FIG. 5G, the TC node of the data cache 110 is discharged, when the logic level of the TC (0) node is high, which is the read data. In this way, the read data is transferred from the data handler 112 to the data cache 110. At the same time of the transmission of the read data to the data cache 110, the next read operation begins. For example, as shown in FIG. 5G, the memory segment 108 is selected again for a read operation and the selected bitlines of the memory segment 108 is pre-charged and the non-selected bitlines are shielded to the ground potential.

Figure 6:
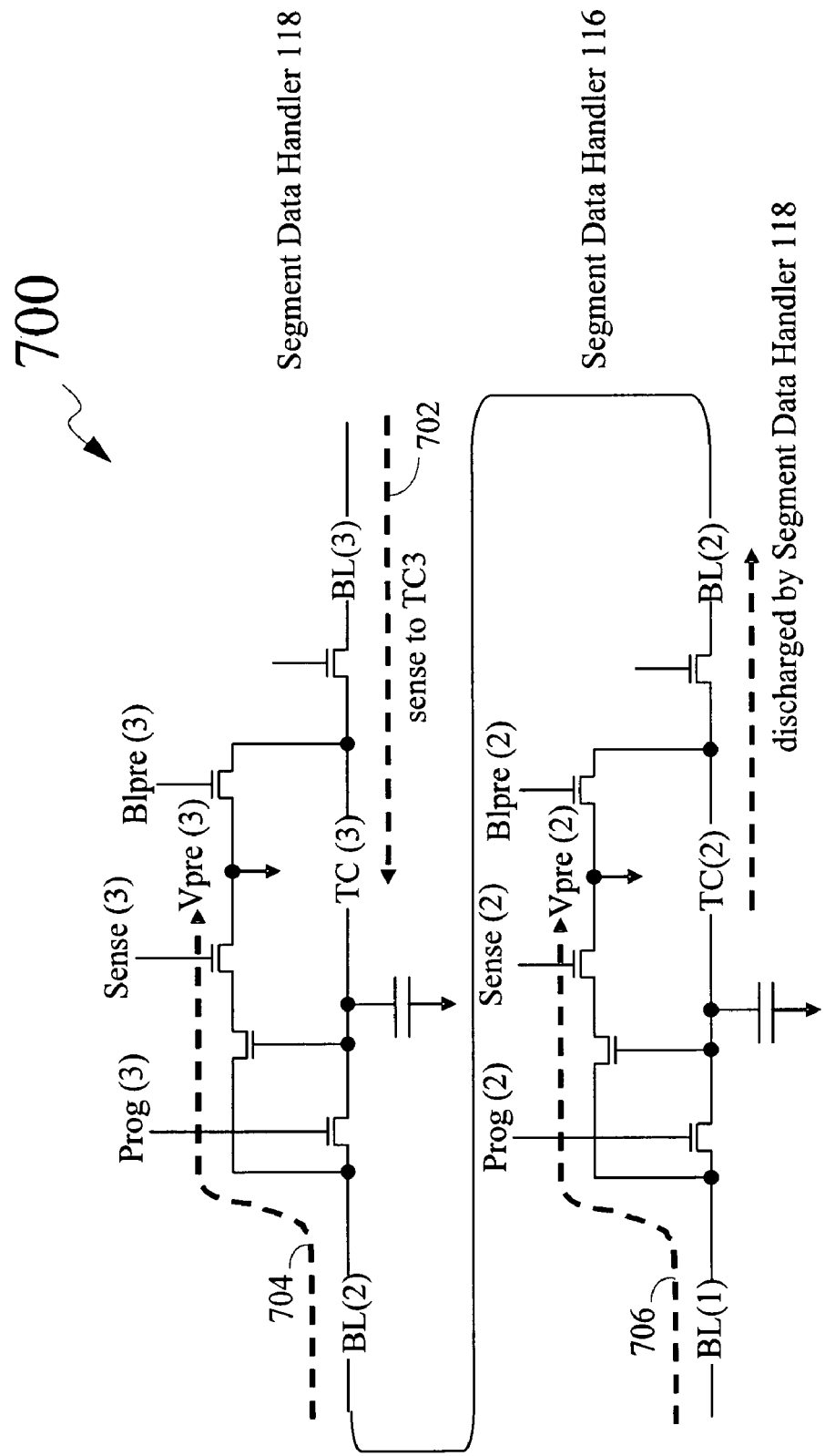
FIG. 6 represents an abbreviated simplified circuit diagram illustrating the transmission of the read data from a data handler to another data handler in the flash memory array of FIG. 1, in accordance with an exemplary embodiment of the present disclosure.

The transmission phase of the read operation may also be explained with the following schematic circuit description. FIG. 6 represents an abbreviated simplified circuit diagram, which describes the transmission of the read data from a data handler to another data handler. For the simplified representation, only a portion of the data handlers is shown. The abbreviations used for the components and the lines are same as used in conjunction with FIGS. 3A, 3B, 3C and 3D. The data handlers taken in the FIG. 6 for the description of the transmission phase are data handlers 118 and 116. The sequence of the transmission is represented by a plurality of arrows (in dashes) in FIG. 6. The arrow 702 indicates that a bitline of the memory segment 108 (BL3) is sensed by the TC (3) node of the data handler 118 to read the data at the BL3.

Further, based on the content of the TC (3) node, a selected bitline of the memory segment 106 (BL2) is discharged or kept at a high logic level. For example, when the TC (3) is of high logic level, the BL2 is discharged (see arrows 704). Further, the logic level of the BL2 is received by the TC (2) of the data handler 106. In this way, the read data is transferred from the data handler 118 to the data handler 116. After transmitting read data to the data handler 116, the data handler 118 may be released and placed in an idle state. Thus, during a subsequent transmission phase, the next read operation may start. Furthermore, based on the content of the TC (2), the selected bitline of the adjacent memory segment, which is the memory segment 104 is discharged or kept at a high logic level. For example, the arrow 706 indicates that the selected bitline of the memory segment 102 is discharged and it is further received by the data handler 112 and finally transmitted to the data cache 110 (not shown in FIG. 6). From the above description, it will be apparent to person skilled in the art that the data handler associated with the selected memory segment senses locally to the selected bitlines and the bitlines between the selected memory segment and the data cache 100 is discharged from hand to hand. Further, in the end, the read data is transmitted to the data cache 110.

Figure 7:
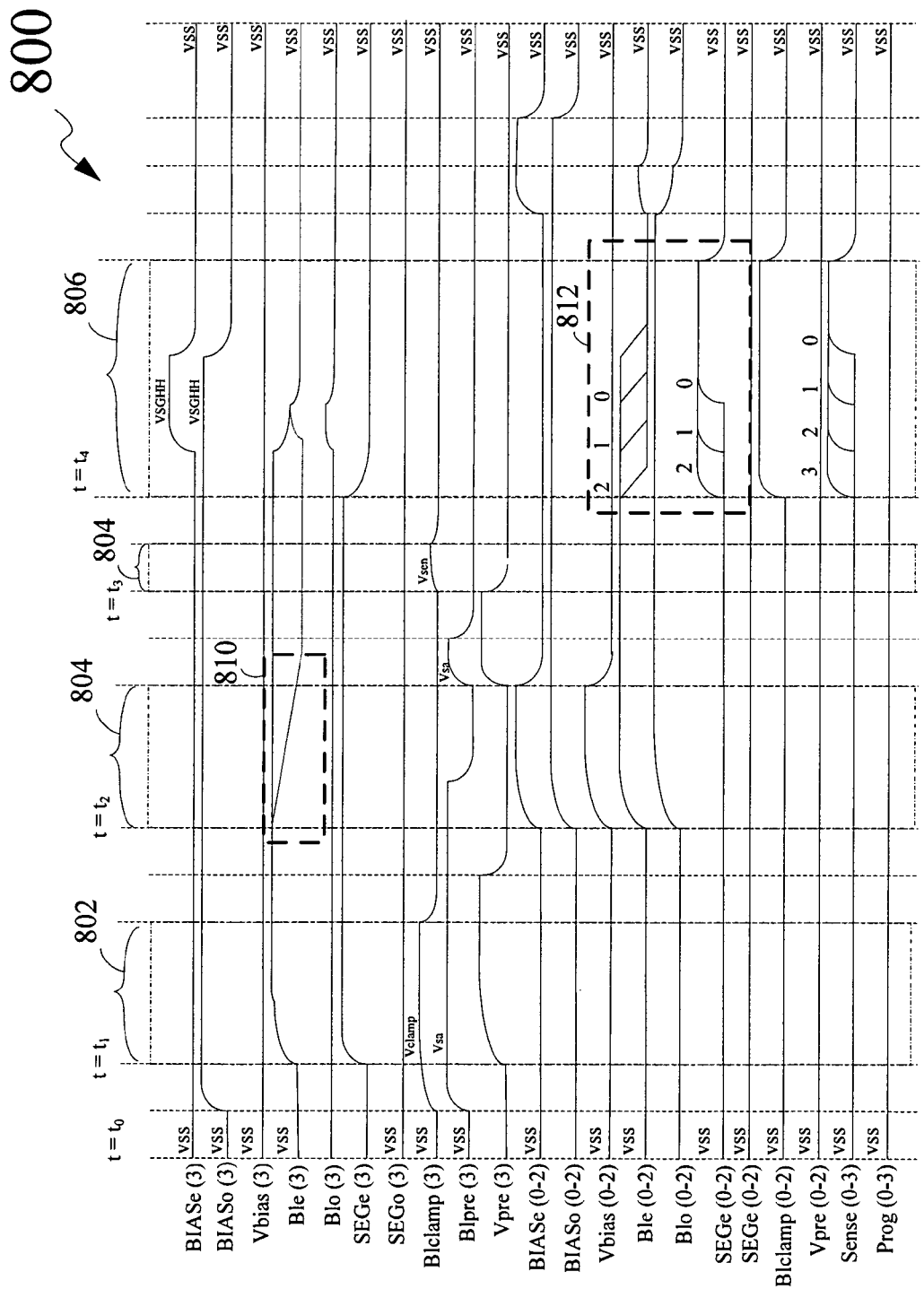
FIG. 7 represents a waveform 800 representing the read operation in the flash memory array of FIG. 1, in accordance with an exemplary embodiment of the present disclosure.

Referring now to FIG. 7, a waveform 800 representing the read operation in the flash memory array 100 is shown, in accordance with an exemplary embodiment of the present disclosure. Herein, the selected memory segment for the read operation is the memory segment 108. The waveform 800 includes a plurality of timing waveforms (not scaled) for signals applied at the lines of the flash memory array 100. The regions 802, 804, 806 and 808 represent the pre-charge phase, the develop phase, the sense phase and the transmission phase of the read operation respectively, as described in conjunction of FIGS. 4A-4C and 5A-5G. As shown in FIG. 7, at t=t0, the signals applied at the plurality of lines are at ground potential (or VSS, a reference potential). Before the pre-charge period, i.e., before between t=0 to t=t1, the signals at the lines BIASo (3) is biased at a high logic level (represented by VSGHH), and blclamp (3) and blpre (3) lines are also provided to a high logic level.

At t=t1, the pre-charge phase starts. The pre-charge phase is represented by the region 802. The SEGe (3) line is provided a high logic level and the line SEGo (3) is maintained at the VSS level. The waveform Vpre (3) also transitions from the VSS to a high logic level (represented by Vsa). The high logic level at the SEGe (3) line and VSS at the SEGo (3) line allow the pre-charging of the bitline BLe (3) and shielding of the bitline BLo (3). It is represented by the waveform of the bitline BLe (3), as its voltage starts rising to the pre-charge voltage, whereas the voltage at the bitline BLo (3) remains at the VSS.

At t=t2, the develop phase of the read operation starts. During the develop phase, i.e., the region 804, the bitline BLe (3) is discharged by the MC. It is represented by a dashed region 810 (see waveform BLe (3)). Further, at t=t2, the other memory segments are also pre-charged. This is performed by biasing the lines BIASe (0-2), BIASo (0-2), Vbias (0-2) to the high logic levels. Correspondingly, the bit lines of the memory segments 102, 104 and 106 are pre-charged to the pre-charge voltage. The pre-charging of the memory segments 102, 104 and 106 is represented by the rising waveforms of the BLe (0-2) and the BLo (0-2) in the region 804.

At t=t3, the sense phase of the read operation begins. During the sense phase (the region 806), the Vpre (3) is transitioned from the high logic level to the VSS. The line blclamp (3) transitions from the VSS to a sense voltage level (represented by Vsen). Thereafter, the read data is sensed into the TC (3) node of the data handler 118 (not shown).

At t=t4, the transmission phase of the read operation begins. During the transmission phase (region 808), the read data is transmitted from the TC (3) (of data handler 118) to the TC node (of the data cache 110) through the TC (2) node of the data handler 116, TC (1) of the data handler 114 and TC (0) of the data handler 112. The transmission of the read data is represented by a dashed region 812. The dashed region 812 is marked by numerals 2, 1 and 0.

Numeral 2 in the dashed region 812 indicates that the read data is transmitted to the TC (2) node of the data handler 116. Similarly, numeral 1 indicates that the read data is transferred from the TC (2) node to the TC (1) node of the data handler 114. Similarly, numeral 0 indicates that the read data is transferred from the TC (1) node to the TC (0) node of the data handler 112. Further, the text 'TC in ddc' (region 812) represents that the read data is transferred from the TC (0) node to the TC node of the data cache 110. The line blclamp (0-2) is provided with the high logic level in order to perform the transmission phase of the read data. Further, the line SEGe 2 is transitioned from the low logic level to the high logic level in order to facilitate the transmission of read data from the TC (3) to the TC (2), as represented in the region of numeral 2. Similarly, the line SEGe 1 and the line SEGe 0 are transitioned to high logic level in the region represented by numeral 1 and 0 respectively. After the transmission phase, i.e., region 808, the lines of the waveform 800 may be brought at the VSS to begin a new read operation in the flash memory array 100.

Based on the description of the waveform 800, it will be obvious to a person skilled in the art that the data is read from a memory segment locally by a data handler coupled to the memory segment. Further, the read data is transmitted to the data cache 110 in a sequential manner through the existing data handlers between the selected memory segment and the data cache 110.

Various embodiments of the present disclosure provide numerous advantages including, but not limited to, shortening the time of the read operation in a flash memory array such as the flash memory array 100 substantially. For example, the read time can be analyzed as compared to a conventional method in terms of the RC time constant as given in Table 1:

TABLE 1

| Phase of read operation | RC delay in a conventional method | RC delay in the present disclosure |
|---|---|---|
| Pre-charge phase | Rbl * Cbl, | Rbl/ * Cbl/n, where n is |
| Develop Phase | Cbl × Vdiff/I cell | Cbl/n × Vdiff/I cell |
| Transmission Phase | none | (n − 1) × Rbl/n × Cbl/n |

Where Rbl and Cbl are resistance and capacitance of the bitlines, n is number of memory segments in the flash memory array 100, Vdiff is a voltage difference between the pre-charge and sense, and Icell is an MC current. Considering a case when n=2, i.e., the number of memory segments in the flash memory array 100 is two, the RC delay in the conventional method is equal to Rbl*Cbl+Cbl*Vdiff/I cell, whereas the RC delay as according to the present disclosure is equal to Rbl*Cbl/2+Cbl*Vdiff/2*I cell. It indicates that the RC delay time in the present disclosure is about half of as the conventional method. Therefore, it will be obvious to a person skilled in the art the time involved in the read operation may also be reduced by the half amount. Further, the present disclosure can be applied to a variety of flash memory arrays containing varied number of memory segments.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A flash memory array comprising:
    a plurality of memory segments, each memory segment of the plurality of memory segments comprising a plurality of memory cell blocks, the plurality of memory cell blocks comprising a plurality of bitlines;
    a data cache configured to store read data of selected bitlines of a selected memory segment, wherein the selected memory segment is a memory segment from the plurality of memory segments selected for a read operation; and
    a plurality of segment data handlers, one segment data handler of the plurality of segment data handlers coupled between the data cache and a memory segment and each of segment data handlers other than the segment data handler coupled between the data cache and the memory segment is coupled between a pair of adjacent memory segments of the plurality of memory segments, each segment data handler configured to
        condition the plurality of bitlines of a memory segment coupled to the each segment data handler, wherein conditioning the plurality of bitlines of the memory segment comprises at least one of pre-charging at least one bitline to a pre-charge voltage and shielding at least one bitline to a reference potential,
        sense read data from at least one bitline of the plurality of bitlines of the memory segment coupled to the each segment data handler, and
        transmit the sensed read data to the data cache;
    wherein the each segment data handler transmits the sensed read data to the data cache through at least one segment data handler laid between the memory segment of the pair of adjacent memory segments and the data cache, when the each segment data handler is coupled between the pair of adjacent memory segments; and
    wherein the each segment data handler transmits the sensed read data to the data cache directly when the each segment data handler is coupled between the data cache and a memory segment.

2. The flash memory array of claim 1, wherein the data cache is configured at an edge of the flash memory array.

3. The flash memory array of claim 1, wherein the reference potential is a ground potential.

4. A method for performing a read operation in a flash memory array, the flash memory array partitioned into a plurality of memory segments, each memory segment comprising a plurality of memory cell blocks, the plurality of memory cell blocks comprising a plurality of bitlines, the method comprising:
- selecting a memory segment of the plurality of memory segments and bitlines of the memory segment for a read operation;
- pre-charging the selected bitlines of the selected memory segment to a pre-charge voltage;
- sensing read data from the selected bitlines of selected memory segment by a segment data handler, wherein the segment data handler is communicably coupled to the selected memory segment; and
- transmitting the read data to a data cache of the flash memory array, wherein transmitting the read data comprising
  - transmitting the read data to the data cache through at least one segment data handler between the data cache and the selected memory segment, where the at least one segment data handler is between the data cache and the selected memory segment, and
  - transmitting the read data from the data handler to the data cache directly, when the segment data handler is directly connected to the data cache.

5. The method of claim 4, wherein pre-charging the selected bitlines of the selected memory segment to the pre-charge voltage further comprising shielding non-selected bitlines of the selected memory segment to a reference potential.

* * * * *